United States Patent
Ouderkirk et al.

(10) Patent No.: US 10,962,791 B1
(45) Date of Patent: Mar. 30, 2021

(54) APPARATUSES, SYSTEMS, AND METHODS FOR FABRICATING ULTRA-THIN ADJUSTABLE LENSES

(71) Applicant: Facebook Technologies, LLC, Menlo Park, CA (US)

(72) Inventors: Andrew J. Ouderkirk, Redmond, WA (US); Katherine Marie Smyth, Seattle, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 270 days.

(21) Appl. No.: 15/972,794

(22) Filed: May 7, 2018

Related U.S. Application Data

(60) Provisional application No. 62/646,900, filed on Mar. 22, 2018.

(51) Int. Cl.
| | | |
|---|---|---|
| *G02B 27/14* | (2006.01) | |
| *G02B 27/01* | (2006.01) | |
| *B29D 11/00* | (2006.01) | |
| *B29K 75/00* | (2006.01) | |

(52) U.S. Cl.
CPC .... *G02B 27/0176* (2013.01); *B29D 11/00009* (2013.01); *G02B 27/0172* (2013.01); *B29K 2075/00* (2013.01); *G02B 2027/0152* (2013.01); *G02B 2027/0178* (2013.01)

(58) Field of Classification Search
CPC .................................................. G02B 27/0176
USPC ......................................................... 359/630
See application file for complete search history.

(56) References Cited

U.S. PATENT DOCUMENTS

| | | | |
|---|---|---|---|
| 3,797,922 A | 3/1974 | Plummer | |
| 5,225,244 A | 7/1993 | Aharoni et al. | |
| 5,663,779 A | 9/1997 | Karasawa | |
| 6,420,441 B1 | 7/2002 | Allen et al. | |
| 7,118,219 B2 * | 10/2006 | Itagaki ..................... | A61B 3/04 351/216 |
| 8,210,678 B1 | 7/2012 | Farwig | |

(Continued)

FOREIGN PATENT DOCUMENTS

| | | |
|---|---|---|
| WO | 2008/156166 A1 | 12/2008 |
| WO | 2010/104904 A2 | 9/2010 |

(Continued)

OTHER PUBLICATIONS

"Adjustable Reading Glasses," Retrieved from internet URL: https://adlens.com/.

(Continued)

*Primary Examiner* — James C. Jones
(74) *Attorney, Agent, or Firm* — FisherBroyles, LLP

(57) ABSTRACT

A method may include bonding a deformable bounding element to a structural support element in which the deformable bounding element and a cavity-adjacent side of the structural support element define a cavity. The method may further include filling the cavity with a deformable medium by injecting the deformable medium past a cavity-opposite side of the structural support element and toward the cavity-adjacent side of the structural support element. The method may additionally include sealing an entry point of the injection of the deformable medium into the cavity. Various other apparatuses, systems, and methods are also disclosed.

15 Claims, 16 Drawing Sheets

(56) References Cited

U.S. PATENT DOCUMENTS

| | | | |
|---|---|---|---|
| 10,698,224 B1 | 6/2020 | Cooke et al. | |
| 10,754,145 B1 | 8/2020 | Ouderkirk et al. | |
| 2003/0003295 A1 | 1/2003 | Dreher et al. | |
| 2006/0024976 A1 | 2/2006 | Waldfried et al. | |
| 2008/0088793 A1 | 4/2008 | Sverdrup et al. | |
| 2008/0123049 A1 | 5/2008 | Volk | |
| 2008/0144185 A1 | 6/2008 | Wang et al. | |
| 2008/0170299 A1 | 7/2008 | Kawabata | |
| 2008/0171431 A1 | 7/2008 | Yu et al. | |
| 2008/0291394 A1 | 11/2008 | Ishak | |
| 2009/0015786 A1 | 1/2009 | Harris | |
| 2010/0075056 A1 | 3/2010 | Axisa et al. | |
| 2010/0202054 A1 | 8/2010 | Niederer | |
| 2010/0238400 A1 | 9/2010 | Volk | |
| 2011/0075096 A1 | 3/2011 | Ishak et al. | |
| 2011/0085131 A1 | 4/2011 | Gupta et al. | |
| 2011/0176105 A1 | 7/2011 | Harris | |
| 2012/0029416 A1 | 2/2012 | Parker et al. | |
| 2012/0041553 A1 | 2/2012 | Gupta et al. | |
| 2012/0092775 A1 | 4/2012 | Duston et al. | |
| 2012/0229754 A1 | 9/2012 | Iyer et al. | |
| 2013/0300635 A1 | 11/2013 | White et al. | |
| 2014/0153102 A1 | 6/2014 | Chang | |
| 2014/0300857 A1 | 10/2014 | Cohen-Tannoudji et al. | |
| 2014/0312737 A1 | 10/2014 | Jenninger et al. | |
| 2015/0116656 A1 | 4/2015 | Stevens et al. | |
| 2015/0146161 A1 | 5/2015 | Rigato et al. | |
| 2015/0323812 A1 | 11/2015 | Ishak et al. | |
| 2016/0004099 A1 | 1/2016 | Steven et al. | |
| 2016/0187985 A1 | 6/2016 | Lim et al. | |
| 2017/0045649 A1 | 2/2017 | Bolis | |
| 2017/0160600 A1 | 6/2017 | Galstian et al. | |
| 2017/0184848 A1 | 6/2017 | Vallius | |
| 2017/0192595 A1 | 7/2017 | Choi et al. | |
| 2017/0317269 A1 | 11/2017 | Zhang et al. | |
| 2018/0255250 A1 | 9/2018 | Price et al. | |
| 2018/0275394 A1 | 9/2018 | Yeoh et al. | |
| 2019/0243123 A1 | 8/2019 | Bohn | |
| 2019/0296218 A1 | 9/2019 | Ouderkirk et al. | |
| 2019/0302479 A1 | 10/2019 | Smyth et al. | |

FOREIGN PATENT DOCUMENTS

| | | |
|---|---|---|
| WO | 2019/183431 A1 | 9/2019 |
| WO | 2019/190887 A1 | 10/2019 |

OTHER PUBLICATIONS

Non-Final Office Action received for U.S. Appl. No. 16/013,837 dated Jan. 23, 2020, 22 pages.

Notice of Allowance received for U.S. Appl. No. 16/013,837 dated Apr. 14, 2020, 14 pages.

Preinterview First Office Action received for U.S. Appl. No. 15/992,731 dated Sep. 27, 2019, 17 pages.

Final Office Action received for U.S. Appl. No. 15/992,731 dated Jun. 2, 2020, 25 pages.

Non-Final Office Action received for U.S. Appl. No. 15/992,731 dated Aug. 24, 2020, 27 pages.

Examiner-Initialed Interview Summary received for U.S. Appl. No. 16/008,635 dated Apr. 20, 2020, 3 pages.

Notice of Allowance received for U.S. Appl. No. 16/008,635 dated May 4, 2020, 32 pages.

Non-Final Office Action received for U.S. Appl. No. 16/059,091 dated Apr. 8, 2020, 54 pages.

Final Office Action received for U.S. Appl. No. 16/059,091 dated Sep. 21, 2020, 18 pages.

Non-Final Office Action received for U.S. Appl. No. 16/106,945 dated Apr. 16, 2020, 59 pages.

Non-Final Office Action received for U.S. Appl. No. 16/041,634 dated Jul. 30, 2020, 24 pages.

Notice of Allowance received for U.S. Appl. No. 16/041,634 dated Aug. 28, 2020, 31 pages.

Preinterview First Office Action received for U.S. Appl. No. 16/018,752 dated Dec. 16, 2019, 19 pages.

Preinterview First Office Action received for U.S. Appl. No. 16/018,746 dated Jul. 14, 2020, 20 pages.

Notice of Allowance Action received for U.S. Appl. No. 16/018,746 dated Sep. 17, 2020, 24 pages.

Preinterview First Office Action received for U.S. Appl. No. 16/021,580 dated Aug. 4, 2020, 48 pages.

Press Kit Home, "Adaptive glasses", accessed at http://tvc.utah.edu, as accessed on Mar. 13, 2018, 5 pages.

Billah et al., "Microstructure Evolution and Electrical Characterization of Lanthanum doped Barium Titanate (BaTi03) Ceramics", International Conference on Mechanical Engineering, AIP Conf. Proc. 1754, accessed on Jul. 12, 2016, pp. 030006-1-030006-7.

Cao et al., Grain Size and Domain Size Relations in Bulk Ceramic Ferroelectric Materials, J. Phys. Chem Solids vol. 57, No. 10, pp. 1499-1505, 1996.

Ding et al., "Surface profiling of an aspherical liquid lens with a varied thickness membrane," Optics Express 3122-3132, vol. 25, No. 4 (Feb. 6, 2017).

He et al., Linear Electro-Optic Properties of Orthorhombic PZN-8%PT Single Crystal, IEEE Transactions on Ultrasonics, Ferroelectrics, and Frequency Control, vol. 58, No. 6 (Jun. 1, 2011).

Knapp et al., "Understanding Zirconia Crown Esthetics and Optical Properties" Inclusive magazine accessed at http://glidewelldental.com/education/inclusive-dental-implant-magazine-volume-2-issue-4/, as accessed on Jun. 12, 2018, vol. 2, Issue 4, 17 pages.

Optotune, "Focus tunable lenses", accessed at http://www.optotune.com/technology/focus-tunable-lenses, accessed on Mar. 13, 2018, 2 pages.

Polight, "How does it work", accessed at http://www.polight.com/technology-and-products/how-does-it-work/default.aspx, accessed on Mar. 13, 2018, 3 pages.

Uzoom Adlens, "Adjustable Lens Glasses: How They Work", accessed at https://adlens.com/how-it-works/, accessed on Mar. 28, 2018, 9 pages.

Piezo Technology, "Highly Reliable Multilayer Piezo Actuators", accessed on https://www.piceramic.com/en/piezo-technology/picma/, accessed on Mar. 14, 2018, 8 pages.

Piezo Technology, "Displacement Modes of Piezoelectric Actuators", accessed on https://www.piceramic.com/en/piezo-technology/properties-piezo-actuators/displacement-modes/, accessed on Mar. 14, 2018, 12 pages.

Jiang et al., "Transparent Electro-Optic Ceramics and Devices", Proceedings vol. 5644, Optoelectronic devices and integration, accessed at https://doi.org/10.1117/12.582105, Jan. 17, 2005, 15 pages.

Keplinger et al., "Stretchable, Transparent, Ionic Conductors", Science Magazine, vol. 341, DOI:10.1126/science.1240228, Accessed on Aug. 30, 2013, pp. 984-987.

Kong et al., "Transparent Ceramic Materials", Transparent Ceramics, Topics in Mining, Metallurgy, and Materials Engineering, Ch. 2, DOI: 10.1007/978-3-319-18956-7_2, Springer international Publishing Switzerland 2015, pp. 29-91.

Patra et al., "Comparison on Optical Properties of Pure and Doped Lithium Tetraborate Single Crystals and Glasses", Solid State Physics: Proceedings of the 56th DAE Solid State Physics Symposium 2011, AIP Conf. Proc. 1447, Dec. 11, 2012, pp. 1335-1336.

Riegler et al., "Index Matching Silicone for High Brightness LED Packaging", IMAPS International Conference on Device Packaging Mar. 13-16, Scottsdale AZ., Accessed on Mar. 18, 2005, 17 Pages.

Shian et al., Tunable Lenses using Transparent Dielectric Elastomer Actuators, Optics Express, vol. 21, No. 7 (Apr. 2, 2013).

Hocking L.M., "The effect of slip on the motion of a sphere close to a wall and of two adjacent spheres", Journal of Engineering Math., vol. 7 (1973), pp. 207-221.

Wang et al., "A Highly Stretchable, Transparent, and Conductive Polymer", Science Advances vol. 3, No. 3, e1602076, Mar. 10, 2017, pp. 1-10.

APC International, Lid., "Piezoelectric Materials, New Materials, Piezo theory", accessed at www.americanpiezo.com/knowledge-center/piezo-theory/new-materials/html, accessed on Mar. 15, 2018, 1 page.

(56) References Cited

OTHER PUBLICATIONS

Zhao et al., "Spherical aberration free liquid-filled tunable lens with variable thickness membrane," Optics Express vol. 23, No. 16, accessed at https://doi.org/10.1364/0.23.021264, accessed on Aug. 5, 2015, pp. 21264-21278.
Andrew J. Ouderkirk, et al.; Apparatuses, Systems, and Methods for Adjusting Fluid Lenses; U.S. Appl. No. 16/008,635, filed Jun. 14, 2018.
Katherine Marie Smyth, et al.; Optical Lens Assemblies, Head-Mounted Displays, and Related Methods; U.S. Appl. No. 16/021,650, filed Jun. 28, 2018.
Andrew John Ouderkirk, et al.; Multi-Element Prescription Lenses With Eye-Tracking; U.S. Appl. No. 16/041,634, filed Jul. 20, 2018.
Andrew John Ouderkirk, et al.; Electroactive Polymer Devices and Nanovoided Polymer Materials and Methods and Systems For Fabrication Thereof; U.S. Appl. No. 16/106,945, filed Aug. 21, 2018.
Andrew John Ouderkirk, et al.; Nanovoided Electroactive Polymer Devices, Systems, and Methods; U.S. Appl. No. 16/041,858, filed Jul. 23, 2018.
Andrew John Ouderkirk, et al.; Electroactive Polymer Devices, Systems, and Methods; U.S. Appl. No. 16/059,091, filed Aug. 9, 2018.
Andrew John Ouderkirk, et al.; Optical Devices, Systems, and Methods of Manufacturing; U.S. Appl. No. 62/646,900, filed Mar. 22, 2018.
Andrew John Ouderkirk, et al.; Optical Devices, Systems, and Methods of Manufacturing; U.S. Appl. No.62/650,254, filed Mar. 29, 2018.
Katherine Marie Smyth, et al.; Optical Lens Assemblies and Related Methods; U.S. Appl. No. 16/018,746, filed Jun. 26, 2018.
Katherine Marie Smyth, et al.; Systems and Methods for Actuation of Asymmetric Optical Elements; U.S. Appl. No. 15/992,731, filed May 30, 2018.
Andrew John Ouderkirk, et al.; Optical Lens Assemblies and Related Methods; U.S. Appl. No. 16/018,752, filed Jun. 26, 2018.
John M. Cooke, et al.; Optical Lens Assemblies, Head-Mounted Displays, and Methods of Altering Optical Properties of Optical Lens Assemblies; U.S. Appl. No. 16/013,837, filed Jun. 20, 2018.
Katherine Marie Smyth, et al.; Optical Lens Assemblies, Head-Mounted Displays, and Related Methods; U.S. Appl. No. 16/016,428, filed Jun. 22, 2018.
John M. Cooke, et al.; Optical Lens Assemblies, Head-Mounted Displays, and Related Methods; U.S. Appl. No. 16/021,580, filed Jun. 28, 2018.
Andrew John Ouderkirk, et al.; Electroactive Polymer Devices, Systems, And Methods; U.S. Appl. No. 16/035,562, filed Jul. 13, 2018.
International Preliminary Report on Patentability received for PCT Application Serial No. PCT/US2019/023485 dated Oct. 8, 2020, 8 pages.
Guha et al., "Creating nanoscale emulsions using condensation", Nature Communications, vol. 8, No. 1371, Nov. 2017, pp. 1-7.
Merriam-Webster, "Porosity", URL: https://www.merriam-webster.com/dictionary/porosity, retrieved on Apr. 8, 2020, pp. 1-8.
International Search Report and Written Opinion received for PCT Application Serial No. PCT/US2019/023484 dated Jul. 3, 2019, 9 pages.
International Preliminary Report on Patentability received for PCT Application Serial No. PCT/US2019/023484 dated Oct. 1, 2020, 8 pages.
International Search Report and Written Opinion received for PCT Application Serial No. PCT/US2019/023485 dated Jul. 4, 2019, 11 pages.

* cited by examiner

APPARATUSES, SYSTEMS, AND METHODS FOR FABRICATING ULTRA-THIN ADJUSTABLE LENSES

This application claims the benefit of U.S. Provisional Application No. 62/646,900, filed 22 Mar. 2018.

BACKGROUND

Putting on a virtual-reality or augmented-reality head-mounted system may be the beginning of a thrilling experience, one that may be more immersive than almost any other digital entertainment or simulation experience available today. Head-mounted systems may enable users to travel through space and time, interact with friends in a three-dimensional world, or play video games in a radically redefined way. Head-mounted systems may also be used for purposes other than recreation—governments may use them for military training simulations, doctors may use them to practice surgery, and engineers may use them as visualization aids.

In any use of a virtual-reality or augmented-reality system, making the experience as immersive as possible may be critical. However, many design features of head-mounted systems may potentially interfere with an immersive experience. For example, many head-mounted systems may be relatively heavy with most of their weight distributed toward the front, potentially resulting in significant pressure on a user's face and leading to discomfort that may make a virtual reality experience less compelling. In addition, attempts to integrate more functionality into head-mounted systems may add thickness and weight, potentially resulting in head-mounted systems that are overly heavy or unwieldy.

SUMMARY

As will be described in greater detail below, the instant disclosure describes a method, system and apparatus for fabricating ultra-thin optical lens assemblies.

In one example, a method may include bonding a deformable element to a structural support element. The deformable element and a cavity-adjacent side of the structural support element may define a cavity. The method may further include filling the cavity with a deformable medium by injecting the deformable medium past a cavity-opposite side of the structural support element and toward the cavity-adjacent side of the structural support element. The method may further include sealing an entry point of the injection of the deformable medium into the cavity.

In some examples, the method may further include filling a reservoir disposed on the cavity-opposite side of the structural support element with the deformable medium. The method may further include pressurizing the deformable medium in the reservoir, thereby causing the deformable medium to flow into the cavity through a gap defined by an edge face of the structural support element and an edge face of the deformable element. In some examples. a major plane of each of the reservoir, the structural support element and the deformable element may be substantially parallel to one another.

In some examples, the gap defined by an edge face of the structural support element and an edge face of the deformable element may be sized such that there is substantially no capillary effect on the deformable medium.

In some examples, the method may further include evacuating air in the cavity compressed by the deformable medium through a check valve disposed in the deformable bounding element having a portion defining a hole. The method may further include removing the check valve disposed in the hole in the deformable bounding element. The method may further include adhering a force distributor to the hole in the deformable bounding element.

The method may further include sealing the entry point of the injection of the deformable medium into the cavity by coating an edge of the structural support element with an adhesion promoting layer and sealing the gap between the edge face of the structural support element and the edge face of the deformable bounding element.

In some examples, sealing the gap defined by an edge face of the structural support element and an edge face of the deformable element may include at least one of heat bonding the edge face of the structural support element to the edge face of the deformable bounding element or ultrasonic welding of the edge face of the structural support element to the edge face of the deformable bounding element.

In some examples, the method may further include adhering a force distributor to the deformable bounding element. In some examples, injecting the deformable medium may include inserting a tube between the deformable bounding element and an edge of the structural support element. The method may further include injecting the deformable medium through the tube.

In some examples, sealing the entry point of the injection of the deformable medium into the cavity may include heating the deformable bounding element and the edge of the structural support element proximal to the tube. The method may further include applying pressure to the tube in a direction perpendicular to a major axis of the tube and fracturing the tube. The method may further include applying pressure to the deformable bounding element in a direction towards the edge of the structural support element.

In some examples, the method may further include adhering a force distributor to the deformable bounding element. The method may further include forming a hole in the structural support element. In some examples, injecting the deformable medium may comprise injecting the deformable medium through the hole in the structural support element. The method may further include sealing the entry point of the injection of the deformable medium into the cavity comprises sealing the hole in the structural support element.

In some examples, the hole in the structural support element may be disposed on a perimeter of the structural support element within a bezel-mounting area, thereby substantially maintaining a clear aperture area afforded by the deformable bounding element and the structural support element.

In some examples, sealing the hole may comprise sealing the hole with an optically clear sealant.

In some examples, bonding the deformable bounding element to the structural support element may include forming a first portion of the deformable bounding element into a shape that defines the cavity. The method may further include adhering a surface of the first portion of the deformable bounding element to a surface of the cavity-adjacent side of the structural support element. The method may further include sealing the cavity by bonding a perimeter edge of the first portion of the deformable bounding element to a perimeter edge of a second portion of the deformable bounding element.

In some examples, bonding the perimeter edge of the first portion of the deformable bounding element to the perimeter edge of the second portion of the deformable bounding element may include crimping the force distributor around the perimeter edges of the first and second portions of the deformable bounding element.

In some examples, the structural support element may include at least one of an eye tracking element or corrective ophthalmic properties.

In some examples, bonding the deformable bounding element to the structural support element, filling the cavity with the deformable medium, and sealing the entry point of the injection may produce an optical lens assembly having a thickness of less than two millimeters.

In one example, an apparatus may include an optical lens assembly having a thickness less than 2 millimeters. In some examples, the optical lens assembly may include a deformable bounding element bonded to a structural support element and a deformable medium disposed between the deformable bounding element and the structural support element.

In some examples, the apparatus may further include a force distributor adhered to the deformable bounding element. In some examples, the force distributor may distribute a force applied by an actuator to a perimeter edge of the deformable bounding element thereby altering the shape of the optical lens assembly and the optical power of the optical lens assembly.

In one example, a system may include a head-mounted device which may include a pair of optical lens assemblies. In some examples, each of the optical lens assemblies may have a thickness of less than two millimeters. In some examples, each of the optical lens assemblies may include a deformable bounding element bonded to a structural support element. In some examples, each of the optical lens assemblies may include a deformable medium disposed between the deformable bounding element and the structural support element.

In some examples, the head mounted device may further include a bezel. In some examples, the optical lens assemblies may be mounted in the bezel. In some examples, the deformable medium may be injected through an entry point within a bezel-mounting area, thereby reducing obstruction of the optical lens assemblies.

In some examples, the ratio of a clear aperture area of the optical lens assemblies to an overall surface area of the optical lens assemblies is greater than 75 percent.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1A:
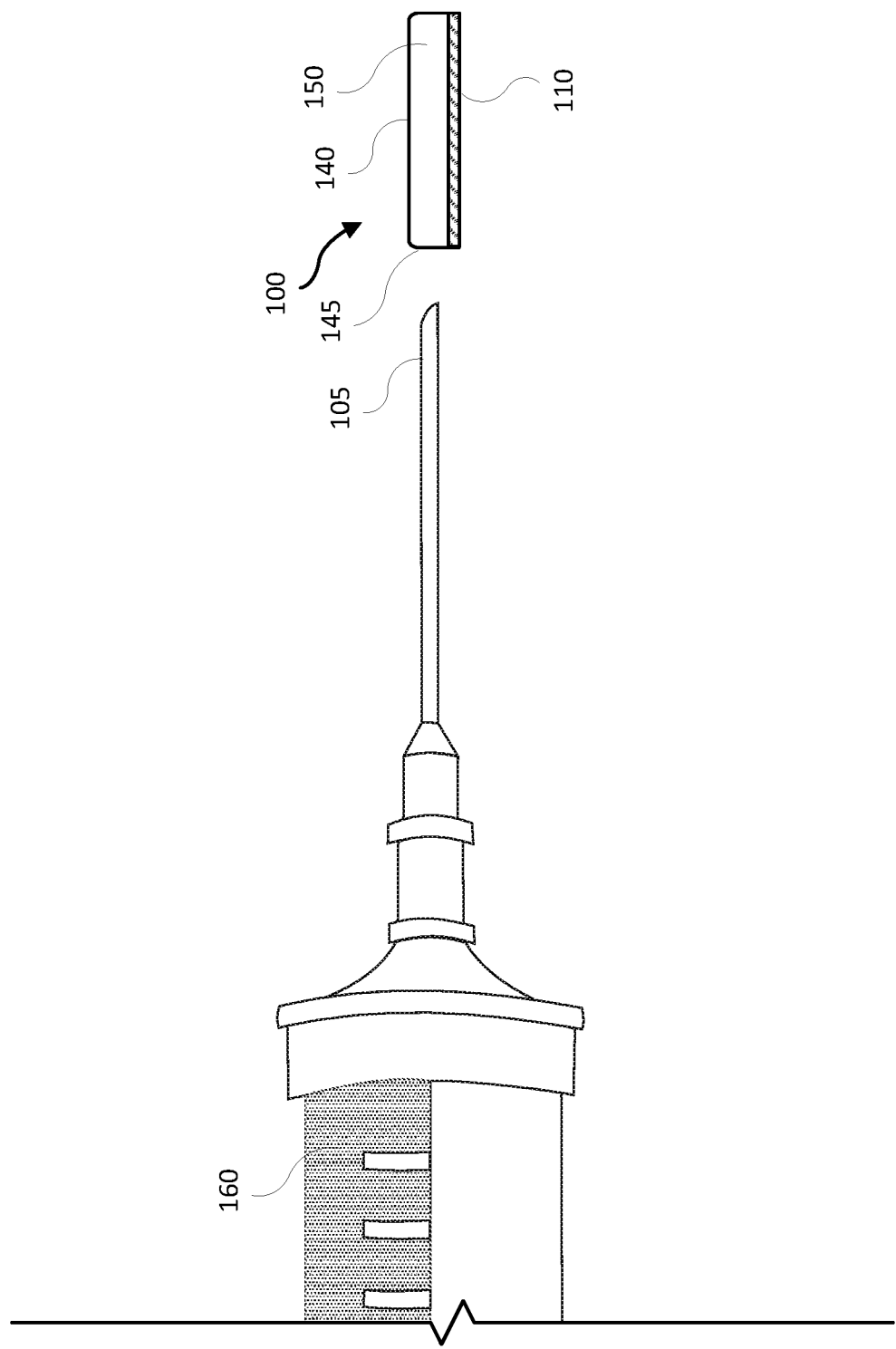
FIG. 1A illustrates a method for filling a deformable optical element.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

This disclosure is generally directed to methods, apparatuses, and systems for manufacturing optical lenses. For example, assembling an optical lens may involve bonding a deformable bounding element (e.g., a flexible film) to a structural support element (e.g., a rigid backing), thereby creating a cavity between the deformable bounding element and the structural support element. In order to fill the cavity with a deformable medium (e.g., an optical fluid), methods described herein may involve injecting the deformable medium into the cavity from behind the structural support element (rather than, e.g., laterally injecting the deformable medium into the cavity from a position between the deformable bounding element and the deformable medium). In this manner, as will be explained in greater detail below, methods described herein may be used to produce ultra-thin deformable optical lenses.

Ultra-thin deformable optical lenses as described herein may provide one or more advantages over other deformable optical lenses. For example, ultra-thin deformable optical lenses may provide adjustable optical power within very small form factors. Furthermore, ultra-thin deformable optical lenses may provide one or more advantages over other ultra-thin optical lenses. For example, as will be described in greater detail below, ultra-thin deformable optical lenses may dynamically adjust (e.g., to change optical power) for any of a wide variety of applications, including vision correction and/or resolving vergence-accommodation conflicts. As will be explained in greater detail below, in some examples the methods for assembling optical lenses described herein may also provide a wide aperture that is substantially free from obstructions. In some examples, an optical lens with a wide aperture that is free from obstructions may be integrated into a device such as a head-mounted display system and may provide an unobstructed wide field of view, thus increasing the performance of the head-mounted display (HMD) and its utility to the user.

Embodiments presented herein may also provide one or more advantages to head-mounted display systems. For example, a head-mounted display system (e.g., a virtual-reality or augmented-reality display system) that uses ultra-thin deformable optical lenses may provide adjustable optical power while minimizing weight placed on and/or protrusions from a user's face. Additionally or alternatively, such ultra-thin deformable optical lenses may provide room for adding other components to a head-mounted display system within given volume and/or weight design constraints. In one example, ultra-thin deformable optical lenses may be used within devices with minimal form factors, such as head-mounted display devices with an eyeglass form factor. As may be appreciated, head-mounted display systems with reduced weight, reduced volumes and/or profiles, comfortable and/or convenient form factors, and/or integrated functionality may improve user comfort, experience, and/or immersion.

FIG. 1A illustrates an example approach for filling an optical lens assembly with a deformable medium (e.g., an optical fluid). As shown in FIG. 1A, an optical lens assembly 100 may include a structural support element 110, a deformable bounding element 140, and a cavity 150. A method of filling optical lens assembly 100 may include inserting a needle 105 (or another type of tube), into cavity 150 (e.g., before attaching a side portion 145 of deformable bounding element 140 to structural support element 110) and injecting deformable medium 160 through tube 105 into cavity 150. As shown in FIG. 1A, the method may involve injecting deformable medium 160 longitudinally into cavity 150 (e.g., substantially in parallel with optical lens assembly 100) such that needle 105 enters between deformable bounding element 140 and structural support element 110. Although optical lens assembly 100 may have a fairly low profile, needle 105 may be sufficiently thin to enter between deformable bounding element 140 and structural support element 110.

Figure 1B:
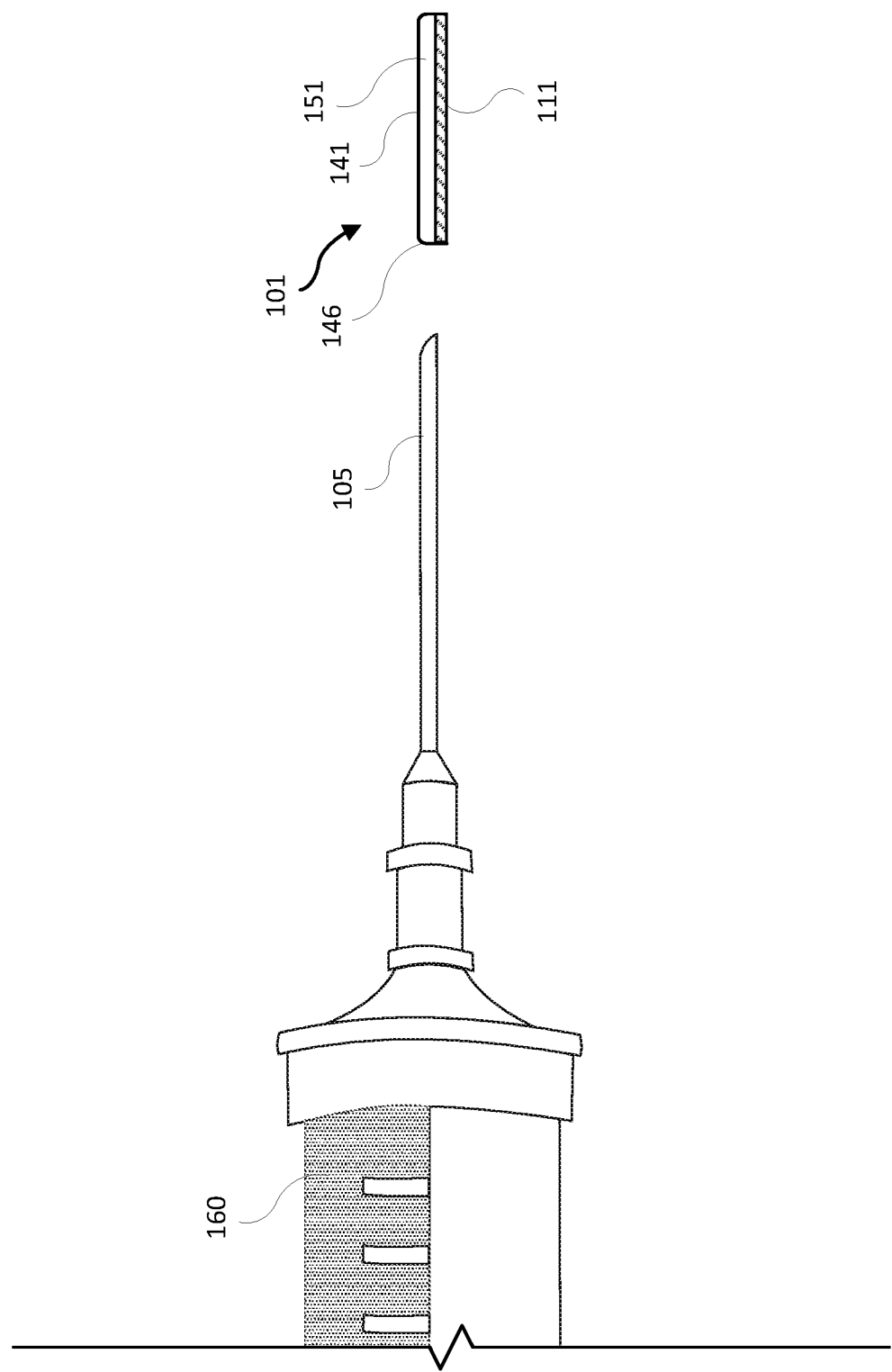
FIG. 1B illustrates an attempt to fill an ultra-thin deformable optical element.

FIG. 1B illustrates an example approach for attempting to fill an ultra-thin optical lens assembly with a deformable medium. As shown in FIG. 1B, an ultra-thin optical lens assembly 101 may include a structural support element 111, a deformable bounding element 141, a deformable bounding element 141 and a cavity 151. As illustrated in FIG. 1B, ultra-thin optical lens assembly 101 has a significantly lower profile in comparison to optical lens assembly 100 in FIG. 1A. As may be appreciated, the method of filling optical lens assembly 100, as described above with reference to FIG. 1A, may be difficult, impractical, and/or ineffective when applied to ultra-thin optical lens assembly 101. For example, the diameter of needle 105 may exceed the height of side portion 146 of deformable bounding element 141 and, therefore, needle 105 may be too large to be inserted in between deformable bounding element 141 and structural support element 111. The relative thinness of optical lens assembly 100 (and, in particular, of cavity 151) may interfere with the use of needle 105 (or similar injection instruments) in any of a variety of ways. In some examples, cavity 151 may be too thin to admit needle 105 between structural support element 111 and deformable bounding element 141. In some examples, attempting to insert needle 105 between structural support element 111 and deformable bounding element 141 into cavity 151 may overstretch and/or damage deformable bounding element 141. Additionally or alternatively, inserting needle 105 and/or injecting the deformable medium 160 laterally between structural support element 111 and deformable bounding element 141 into cavity 151 with sufficient precision to successfully fill cavity 151 with the deformable medium 160 may be difficult and/or impractical. In some examples, attempts to inject deformable medium 160 into cavity 151 may trap air bubbles as air has insufficient room to escape given the thinness of cavity 151. Additionally, inserting the needle may create a defect in the side portion 146 and/or may lead to leakage or failure of at least a part of side portion 146. Accordingly, embodiments discussed in greater detail below may provide alternative methods for manufacturing ultra-thin optical lens assemblies.

In order to overcome the potential deficiencies of filling the ultra-thin optical lens assembly as described in FIG. 1B (e.g., from the side of the optical lens assembly, via an insertion between the structural support and the deformable bounding element from outside the optical lens assembly into the cavity, and/or via a longitudinal injection), various methods of assembling the ultra-thin optical lens assembly may involve filling the cavity through alternative entry points. For example, methods discussed herein may involve injecting the deformable medium from behind the structural support element, past the structural support element, and into the cavity. Thus, in some examples, methods discussed herein may inject the deformable medium in a direction substantially parallel to the short axis of the optical lens assembly (e.g., substantially normal to the structural support element and/or the deformable bounding element).

Figure 2A:
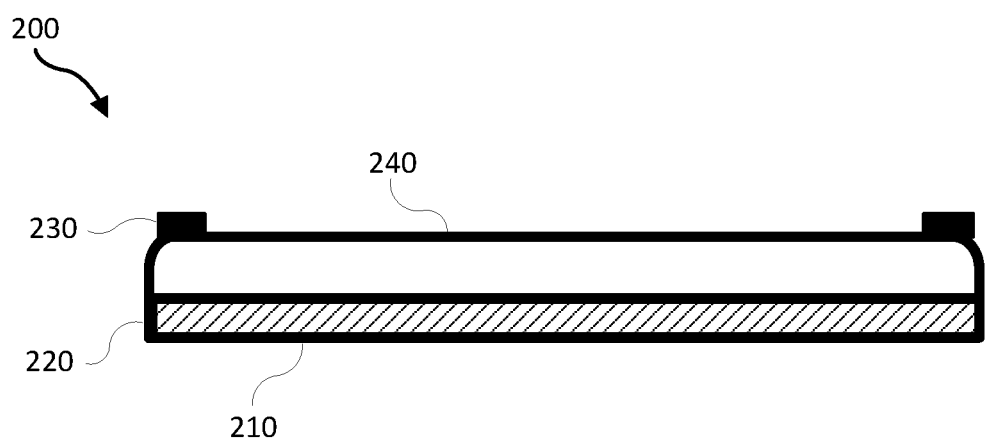
FIG. 2A is an illustration of an optical lens assembly.

FIG. 2A illustrates an example of an optical lens assembly. As shown in FIG. 2A, an optical lens assembly 200 may include a structural support element 210, an edge seal 220, a force distributor 230, a deformable bounding element 240, and a cavity 250. Edge seal 220 may seal deformable bounding element 240 to the edge of structural support element 210 and cavity 250 may be encapsulated between deformable bounding element 240 and structural support element 210. Edge seal 220 may thereby contain the deformable medium within cavity 250. Force distributor 230 may couple deformable bounding element 240 to an external actuation mechanism (not shown). When the external actuation mechanism applies a force or pressure to force distributor 230, force distributor 230 may distribute the force to the perimeter of deformable bounding element 240, causing the surface of deformable bounding element 240 to deform and thereby modify one or more optical properties of optical lens assembly 200 (e.g., the optical power of optical lens assembly 200). Various types of structural support element may be suitable for sealing deformable bounding element 240 to structural support element 210 along edge seal 220, enabling the use of ophthalmic, eye tracking or other optical elements as the structural support element 210.

Figure 2B:
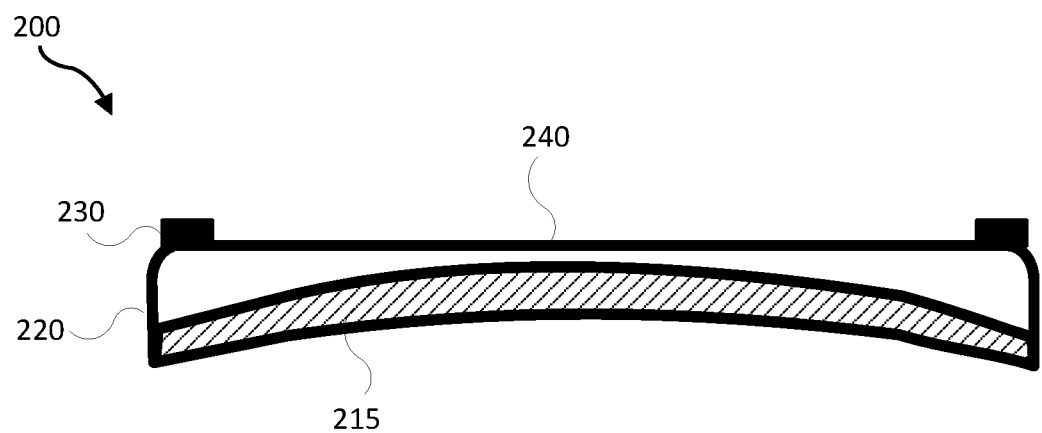
FIG. 2B is an illustration of an optical lens assembly with an ophthalmic substrate.

FIG. 2B illustrates an example of an optical lens assembly with an ophthalmic substrate. As shown in FIG. 2B, an optical lens assembly 200 may include an ophthalmic substrate 215, an edge seal 220, a force distributor 230 and a deformable bounding element 240 in a structure analogous to optical lens assembly 100. Ophthalmic substrate 215 may have corrective optical properties (e.g., correcting a user's vision).

Figure 3:
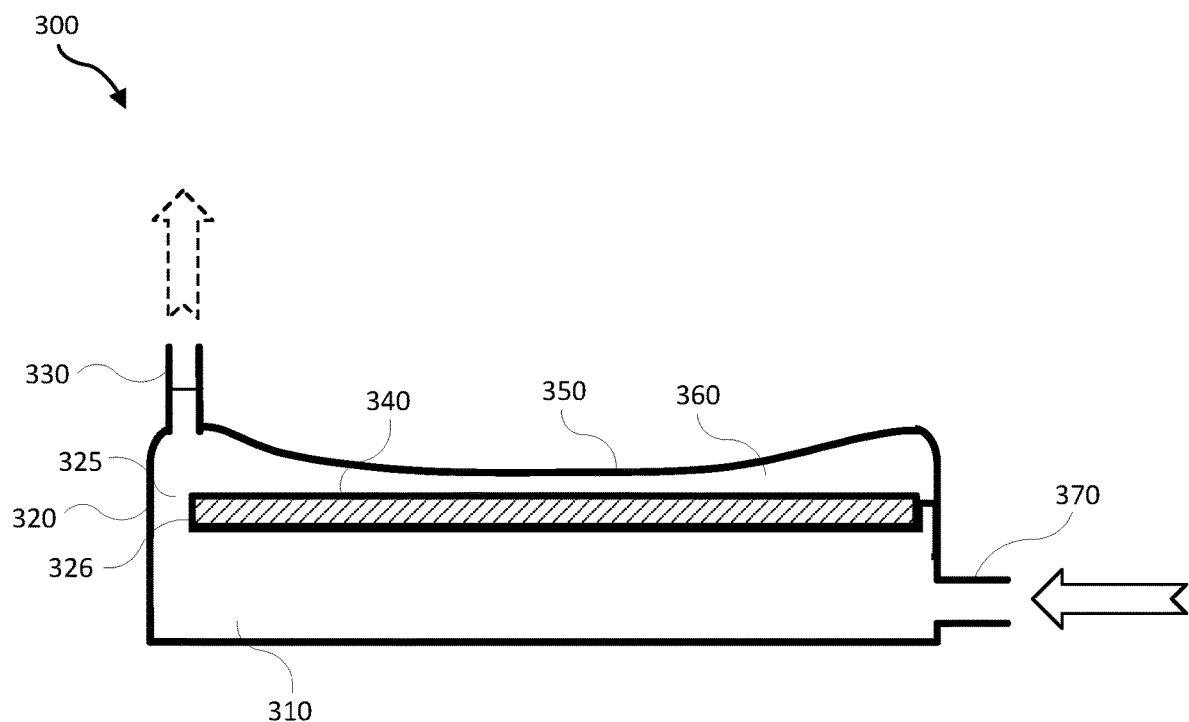
FIG. 3 is an illustration of an optical lens assembly fixtured within a deformable medium reservoir.
Figure 4:
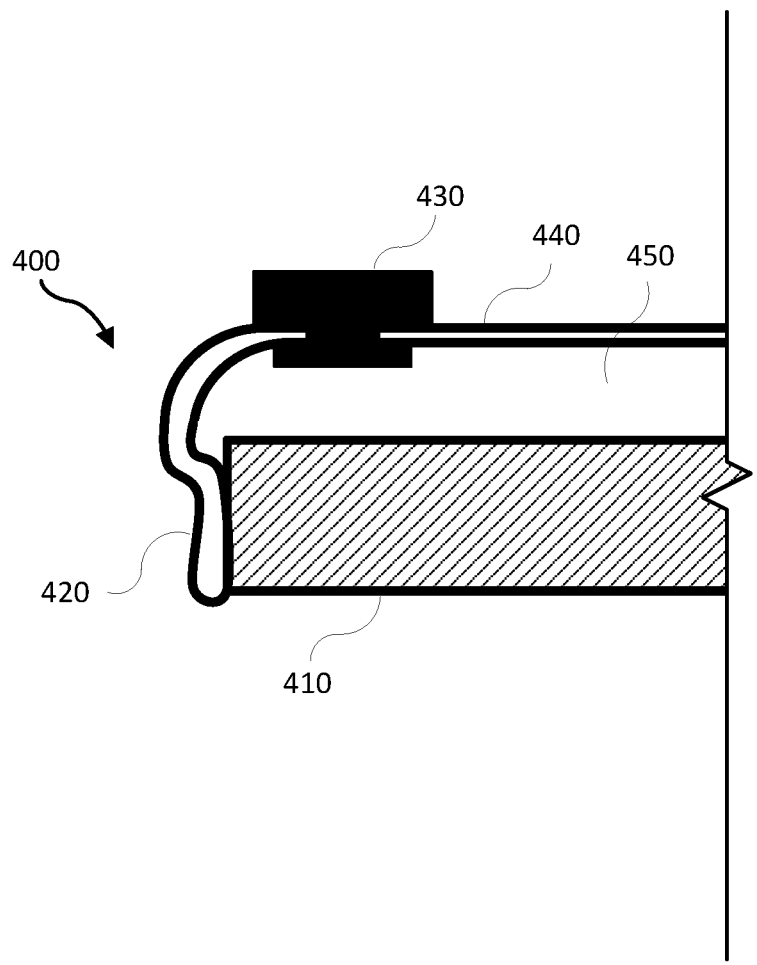
FIG. 4 is a partial view of an optical lens assembly with a force distributor adhered to a hole in a deformable bounding element.
Figure 5:
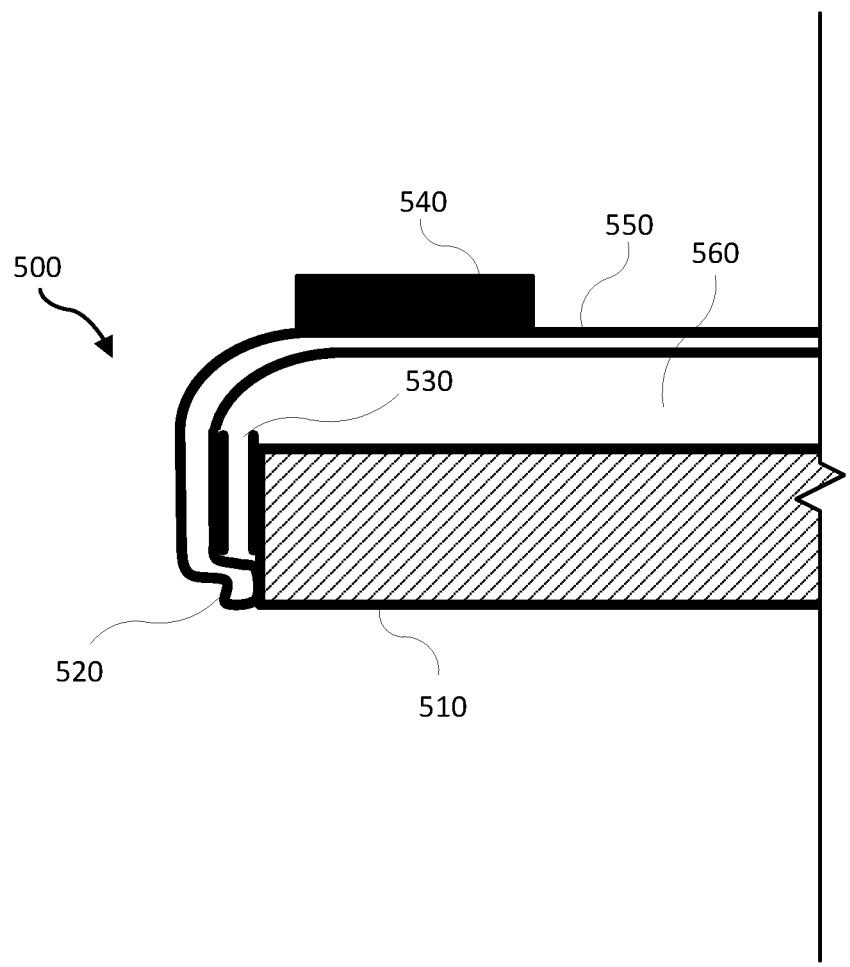
FIG. 5 is a partial view of an optical lens assembly with a filling tube inserted between a deformable bounding element and a structural support element.

By way of example, FIGS. 3-5, which will be discussed in greater detail below, show various methods used to produce the optical lens assembly structures shown in FIGS. 1 and 2. The methods described in reference to FIGS. 3-5 are shown with a flat substrate (e.g., similar to structural support element 111) but may be compatible with other substrate types including ophthalmic substrates and therefore could also be used for assemblies similar to optical lens assembly 200.

As discussed earlier, the deformable optical lenses discussed herein may be adjusted (e.g., thereby modifying one or more optical properties of the deformable optical lenses). For example, an optical lens assembly may be integrated with an actuator on or near the perimeter of the deformable bounding element. Actuation along the perimeter of the deformable bounding element may apply a force to the perimeter of the deformable bounding element (e.g., downward onto the deformable bounding element, radially inward onto the deformable bounding element, etc.), thereby increasing the pressure of the deformable medium in the cavity. The increased pressure of the deformable medium may apply a force against the deformable bounding element, thereby changing the curvature of the deformable bounding element and its optical power. The direction and magnitude of the applied force may be variable and thus may determine the variable optical power of a deformable optical element. The deformable optical element may be an element capable of providing variable optical properties through deformation (e.g., the deformable optical element may include a deformable lens that provides variable optical power). In some examples, the deformable optical element may include a deformable bounding element, a deformable medium, and/or a structural support element. The deformable bounding element may be any element that, when deformed, changes at least one optical property of the optical lens assembly. The deformable medium may be an optically transparent medium that is capable of being deformed by a deformable bounding element. The structural support element may be an element that provides structural support for the deformable medium. The curvature and focal length of the deformable optical element may be switched from convex to concave. In some examples, optical lens assemblies described herein may be varifocal, have high transmissivity of light, and may achieve low off-axis aberration and distortion for high image display quality over a wide range of optical powers.

The optical lens assemblies produced by the methods of the instant disclosure may also provide a wide aperture which may be free (or substantially free) from obstructions. An optical lens assembly with a wide aperture which is free from obstructions may be integrated into a device such as an HMD and provide an unobstructed wide field of view, thus increasing the performance of the HMD and its value to the user. Some of the methods for filling optical lens assemblies described herein may be applied by filling the optical lens assembly through a perimeter area of the optical lens assembly and, therefore, one or more components used in the filling process which may contribute to an obstruction may be located in the perimeter area. When the optical lens assembly is integrated into an HMD, the perimeter area may be concealed by a bezel of the HMD, thereby maintaining a clear aperture area of the deformable optical element and increasing the performance and comfort of the HMD.

The optical lens assembly produced by the methods of the instant disclosure may also be ultra-thin and lightweight. Filling an optical lens assembly through a hole in the structural support element or past the edge of the structural support element may reduce the thickness of the optical lens assembly. Further, the reduced thickness of the optical lens assembly may reduce the weight of the optical lens assembly. For example, the optical lens assembly may have a thickness less than about 3 mm, less than about 2 mm, less than about 1.5 mm, less than 1.0 mm, less than about 0.8 mm, less than about 0.7 mm, less than about 0.6 mm, less than about 0.5 mm, or less than about 0.4 mm. In some examples, the thickness of the optical lens assembly may be measured as the distance from the center of the outer surface of the deformable bounding element to the cavity-adjacent side surface of the structural support element when the optical lens assembly is in an undeformed state. In some examples, the optical lens assembly produced by the methods of the instant disclosure may also use materials which are lightweight. An HMD with ultra-thin and lightweight deformable optical elements may be more comfortable for a user to wear for extended periods of time.

The optical lens assembly may also be interfaced or integrated with other components such as ophthalmic lens components, eye tracking components, and/or wave guide components. The optical lens assembly may include a structural support element which may be shaped with a curvature that provides an ophthalmic lens which corrects for vision impairment of the user. The optical lens assembly may also be integrated with an eye tracking system which may track where the user is looking and/or the motion of an eye relative to the head. The eye tracking system may increase functionality and user satisfaction levels in an AR/VR system and may include a selective-transmission element which transmits light having a selected property (e.g., visible light) but does not transmit light that does not have the selected property (e.g., infrared light). The selective-transmission element may be used to facilitate eye tracking in which an infrared light source will be reflected by the selective-transmission element back to an eye-tracking camera. In some examples, when the optical lens assembly includes an ophthalmic lens, light may be reflected and processed differently by the eye-tracking system than when the optical lens assembly does not include an ophthalmic lens. The eye-tracking system may include a controller to control the processing of the eye-tracking system.

The optical lens assembly may also be integrated with a wave guide, which may provide a virtual display that allows computer generated images to be viewed alongside real images by the user.

When the optical lens assemblies of the instant disclosure are integrated into an HMD, the HMD may be comfortable to wear for long periods of time due to the lighter weight, be aesthetically pleasing due to the ultra-thinness of the optical lens assembly, provide lower manufacturing costs, provide space for additional functional components, increase manufacturing yield, and provide an improved augmented-reality experience due to the obstruction-free field of view and wide aperture.

The deformable bounding element may deform, flex and/or stretch in response to pressure from the deformable medium within an adjacent cavity. The deformable bounding element may be any element that, when deformed, changes at least one optical property of the optical lens assembly. For example, the deformable bounding element may be a flexible film. The optical properties may include accommodative properties, such as adjusting optical power, and/or adaptive properties, such as controlling, compensating, or correcting for wavefront errors, such as distortion and aberrations.

The deformable bounding element may have any of a variety of properties. For example, the deformable bounding element may be substantially optically clear. In some examples, as used herein, the term "substantially optically clear," as applied to an element, may refer to an element capable of transmitting an image through the element. In various examples, an element that is "substantially optically clear" may be capable of transmitting about 70% or more of incident light, about 80% or more of incident light, about 85% or more of visible light, or about 90% or more of incident light.

The deformable bounding element may include any of a variety of materials. For example, the deformable bounding element may include one or more flexible materials that may be shaped in response to one or more applied forces. In some examples, the deformable bounding element may include one or more tensioned or non-tensioned linear elastic and hyper-elastic polymers (examples are silicones and thermoplastic polyurethane (TPU), etc.). The deformable bounding element may also be higher modulus polymers such as polyethylene terephthalate (PET), polyethylene naphthalate (PEN) or polyvinylidene fluoride (PVDF). Preferable, the deformable bounding element has a low creep. Higher modulus materials may also be used, such as glass, crystals, and ceramics. In various examples, the deformable bounding element may have a Young's modulus of less than about 100 gigapascals (GPa), less than about 10 GPa, less than about 2 GPa, or less than about 1 GPa.

The structural support element may function as a backing for an optical lens assembly when the deformable bounding element is bonded to the structural support element. For example, the structural support element may form a backing of a deformable medium cavity, a deformable bounding element and a deformable medium to the form the optical lens assembly shown in FIGS. 2A and 2B. The structural support element may have any of a variety of properties. For example, the structural support element may be substantially optically clear.

The structural support element may include any of a variety of materials. For example, the structural support element may include glass, sapphire, acrylic, silica, ceramics, polycarbonates. In some examples, the structural support element may include optically clear, thin, and/or rigid substrates. In various examples, the structural support element may include flat or meniscus lens substrates. The structural support element may have a physical stress—strain curve that is linear or non-linear. The structural support element may have a rigidity sufficient to prevent the structural support element from substantially bending, deforming or changing shape during and/or after repeated cycles of deformation of the deformable bounding element due to pressure transmitted by the deformable medium within the cavity between the structural support element and the deformable bounding element.

In some examples, the composition of the structural support element material may be fairly uniform and may therefore provide a constant index of refraction throughout the material (e.g., in the range of 1.2 to 2.0). According to some examples, structural support element may be substantially flat, contributing no optical power to the optical lens assembly. In some examples, the structural support element may be shaped as a convex-concave or meniscus lens, in which one surface of the structural support element has a radius of curvature and the opposite side of the structural support element has a different radius of curvature. The difference in curvature between the two surfaces may thereby create a corrective power in the structural support element. The difference in curvature between the two surfaces may be constant, providing a constant optical power across the aperture of the structural support element, or the difference in the radius of curvature may be continuously variable across one or both of the surfaces (resulting in different optical powers being provided at different locations on the structural support element).

As described above, the deformable optical element may be filled with a deformable medium. The deformable medium may function as a medium that transfers pressure in a cavity to a deformable bounding element. The deformable medium may be substantially optically clear. The deformable medium may have a viscosity range of about 0.001 to 1 pascal-seconds which may allow the deformable medium to flow through or past the components used during the process of filling the cavity with the deformable medium. In addition, the viscosity of the deformable medium may allow the deformable medium to flow within the cavity during adjustment of the deformable optical element focusing. The deformable medium may transmit the pressure applied by actuation of the optical lens assembly (e.g., by actuators on the perimeter of the optical lens assembly) to the deformable bounding element. The actuation may take any of a variety of forms, including, e.g., mechanical and/or electro-mechanically actuation.

The deformable medium may include any of a variety of materials. For example, the deformable medium may include water, glycerol, a gel, a polymer-gel, a foam, a polymer, silicone oil, phenyl silicone oil, or a combination thereof. In various examples, pressure applied to the deformable medium may propagate through the deformable medium, affecting a change in curvature of the deformable medium as contained by the deformable bounding element. For example, the deformable medium in the cavity may have a near constant volume and may transmit the pressure as a hydraulic pressure and thus may be a non-compressible deformable medium. The viscosity of the deformable medium may allow the pressure to be transmitted quickly, resulting in low latency when adjusting the focal point. Alternatively, the deformable medium may be a gas, which may apply a pneumatic pressure to the deformable bounding element and thereby changes the curvature of the deformable bounding element (and, therefore, the focal point of the optical lens assembly). In some examples, the deformable medium may also include a liquid that extends the operating temperature range of the deformable optical element (e.g., ethylene glycol). In one example, assembling an ultra-thin optical lens assembly may include bonding a deformable bounding element to a structural support element. As mentioned above, the deformable bounding element and the structural support element and may form a cavity in a space between the deformable bounding element and the structural support element when bonded together. As an example, the deformable bounding element and a cavity-adjacent side of the structural support element may define a cavity. The cavity-adjacent side of the structural support element may be a side which is adjacent to a cavity, gap, chamber or space formed between the deformable bounding element and the structural support element. The cavity-opposite side of the structural support element may be a side which is opposite to the cavity-adjacent side of the structural support element. As an example, the method of filling the cavity with a deformable medium may include injecting the deformable medium past a cavity-opposite side of the structural support element and toward the cavity-adjacent side of the structural support element.

As an example, the method of filling the cavity may include flowing or injecting the deformable medium from one side to another side of the substrate, laterally around a side of the substrate, from underneath the substrate to the top of the substrate and/or through a hole, void, channel, duct, groove, pipe, tube and/or slit in the substrate. The shape of the structural support element may be any of a variety of shapes, including, without limitation, substantially planar, biconvex, biconcave, plano-convex, plano-concave, positive meniscus, or negative meniscus.

After the cavity is filled with the deformable medium, the entry point of the injection of the deformable medium into the cavity may be sealed to contain the deformable medium in the cavity. As an example, the entry point of the injection of the deformable medium into the cavity may be a point on the side of the structural support element which is opposite the cavity, a point on the side of the structural support element adjacent to the cavity or a point on the perimeter or near the edge of the structural support element. The entry point seal may prevent the deformable medium from leaking out of the cavity and may be capable of withstanding the hydraulic or pneumatic pressure of the deformable medium when the deformable bounding element is deformed.

Sealing the entry point may include bonding an edge face of the deformable bounding element which may be a side of the deformable bounding element along the perimeter of the deformable bounding element to an edge face of the structural support element which may be a side of the structural support element along the perimeter of the structural support element.

Before sealing the entry point, the method may include coating an edge of the structural support element with an adhesion promoting layer or primer which increases the strength of the seal. Sealing the entry point may include using adhesives, heat bonding, ultrasonic welding, a plug, an optically clear sealant, and/or a cement compatible with the material of the structural support element. Sealing the entry point between the edge of the deformable bounding element and the structural support element may include heat bonding or ultrasonic welding or adhesives (e.g., glue, paste, resin, sealant, cement, or epoxy) which are compatible with the materials used in the deformable bounding element and the structural support element. Additionally or alternatively, sealing the entry point in a hole in the structural support element may include inserting a plug into the hole.

FIG. 3 illustrates an example of an optical lens assembly fixtured within a deformable medium reservoir. As shown in FIG. 3, an optical lens assembly 300 may include a deformable medium reservoir 310, an edge face of a deformable bounding element 320, a gap 325, an edge face of a structural support element 326, a check valve 330, a structural support element 340, a deformable bounding element 350, a cavity 360 and an inlet 370. As an example, deformable bounding element 350 may be stretched, molded, and/or formed out of, for example, a thermoplastic polyurethane (TPU) and the edge of structural support element 340 may be optionally coated with an adhesion-promoting layer or treatment, for example, a TPU-based coating. Deformable bounding element 350 and structural support element 340 may be separately fixtured within deformable medium reservoir 310 to create gap 325 in at least one region between the edge face of structural support element 326 and the edge face of deformable bounding element 320. Deformable medium reservoir 310 may include any type of container, receptacle, basin, pan, bowl, or tub capable of fixturing deformable bounding element 350 and structural support element 340 and containing the deformable medium.

Pressurized deformable medium may enter deformable medium reservoir 310 through inlet 370. The deformable medium pressure may be generated from any suitable pressure source (e.g., a source of hydraulic or pneumatic pressure). For example, the pressure may be supplied via a pump for the deformable medium. The cavity of the deformable optical element may be filled from the cavity-opposite side of the substrate (i.e., a side of the substrate opposite to a side of the substrate adjacent to the cavity). The pressure of the deformable medium in deformable medium reservoir 310 may cause the deformable medium to flow through gap 325 in a direction from the cavity-opposite side of structural support element 340 to the cavity-adjacent side of structural support element 340. In some examples, the deformable medium entering the cavity-adjacent side of structural support element 340 may displace air in cavity 360, thereby causing an increase in air pressure in cavity 360. The increase in air pressure in cavity 360 may cause the air to exhaust from cavity 360 through check valve 330. Check valve 330 may be a device which operates as a one-way valve allowing a substance (e.g., air and/or the deformable medium) to exit cavity 360 but not enter cavity 360. Check valve 330 may include any suitable valve mechanism including, without limitation, a spring-loaded ball check valve, a diaphragm check valve, a swing check valve, or a microelectromechanical (MEMS) check valve.

The deformable medium may continue to enter cavity 360 and displace the air, which may be exhausted through check valve 330, until the air is completely evacuated from cavity 360. The deformable medium filling operation may include the priming and operation of a diaphragm or deformable bounding element pump. Once cavity 360 is filled with deformable medium, pressure may be applied to the edge face of deformable bounding element 320, in proximity to gap 325 and in a direction towards the edge face of structural support element 326, to form a seal between the edge face of deformable bounding element 320 and the edge face of structural support element 326. The size of gap 325 may be designed to minimize deformation to the edge face of deformable bounding element 320 during pressure contact while preventing capillary effects or action on the deformable medium during the filling process. In some examples, capillary effects on the deformable medium may occur due to intermolecular forces between the deformable medium and the solid surfaces surrounding the gap. If the diameter of the gap is sufficiently small, then the combination of surface tension (which is caused by cohesion within the deformable medium) and adhesive forces between the deformable medium and the surfaces surrounding the gap act to propel the deformable medium. Accordingly, in some examples, the gap may be sized sufficiently to prevent or reduce capillary action. The seal between the edge face of deformable bounding element 320 and the edge face of structural support element 326 may be formed with heat bonding, adhesives, or ultrasonic welding.

FIG. 4 provides a partial view of an example optical lens assembly with a force distributor adhered to a hole in a deformable bounding element. As shown in FIG. 4, an optical lens assembly 400 may include a structural support element 410, an edge seal 420, a force distributor 430, a deformable bounding element 440, and a cavity 450. In some examples, FIG. 4 shows a partial view of optical lens assembly 400 after the process described with respect to FIG. 3 is complete. Edge seal 420 formed between structural support element 410 and deformable bounding element 440 encapsulates cavity 450. The check valve may be removed from deformable bounding element 440 and the hole left in deformable bounding element 440 caused by the removal of the check valve may be plugged by adhering force distributor 430 to the hole. Force distributor 430 may be adhered to deformable bounding element 440 using any suitable method, including, without limitation, adhesives, heat bonding, ultrasonic bonding, mechanical locking and/or adherence, or anodic bonding. The optical lens assembly formed by the above described method may be seamless as edge seal 420 may be uniform along the perimeter of structural support element 410. There may be minimal and non-visible obstruction where the check valve was removed from the hole in structural support element 410 and is obscured by force distributor 430.

FIG. 5 provides a partial view of an example optical lens assembly with a filling tube inserted between a deformable bounding element and a structural support element. As shown in FIG. 5, an optical lens assembly 500 may include a structural support element 510, an edge seal 520, a fill tube 530, a force distributor 540, a deformable bounding element 550, and a cavity 560. FIG. 5 shows a partial view of an optical lens assembly 500 produced by a method which may include an edge seal filling process that may be used to create deformable optical element assemblies 100 and 200. Similar to the method described with respect to FIG. 3, deformable bounding element 550 may stretched, molded, and/or formed out of thermoplastic polyurethane (TPU) and the edge of structural support element 510 may be coated with TPU-based coating. Force distributor 540 may be adhered to deformable bounding element 550 before or after filling cavity 560.

A notched or non-uniform compressive strength fill tube 530 or needle may be inserted at the interface between deformable bounding element 550 and structural support element 510. The assembly may be heated to form a sealing bond between deformable bounding element 550 and structural support element 510. Fill tube 530 may be any device capable of transporting the deformable medium from a deformable medium source into cavity 560. Examples of fill tube 560 include, without limitation, a tube, a duct, a pipe, a hose, an instrument, a needle a cylinder, or a channel which acts as a conduit for transporting the deformable medium into cavity 560. Cavity 560 may be filled by injecting the deformable medium through fill tube 530 at the interface between deformable bounding element 550 and structural support element 510. When the assembly has reached a set temperature and after cavity 560 is filled with deformable medium, pressure may be applied to fill tube 530 in a direction perpendicular to a major axis of fill tube 530 (e.g., a force applied to fill tube 530 may include a component that is perpendicular to the major axis of the fill tube). The applied pressure may thereby cause fill tube 530 to fracture, sheer, or break at the notch on fill tube 530 or the region of lowest compressive strength on fill tube 530. The applied pressure may then cause a portion of the edge of deformable bounding element 550 near the point of insertion of fill tube 530 to contact the adhesive along the edge of structural support element 510 forming edge seal 520. The seal may be formed via heat bonding of the adhesive or through any of the above-mentioned methods.

In FIG. 5, a partial view of optical lens assembly 500 near fill tube 530 insertion point is shown after a portion of the edge of deformable bounding element 550 is sealed to the edge of structural support element 510. The applied perpendicular pressure and heat bonding of the adhesive forms edge seal 520 under fractured fill tube 530. A portion of fractured fill tube 530 and deformable medium in cavity 560 may be sealed between the edge of structural support element 510 and deformable bounding element 550. Adhering force distributor 540 to an outer surface of deformable bounding element 550 may further augment the optical lens assembly.

Figure 6:
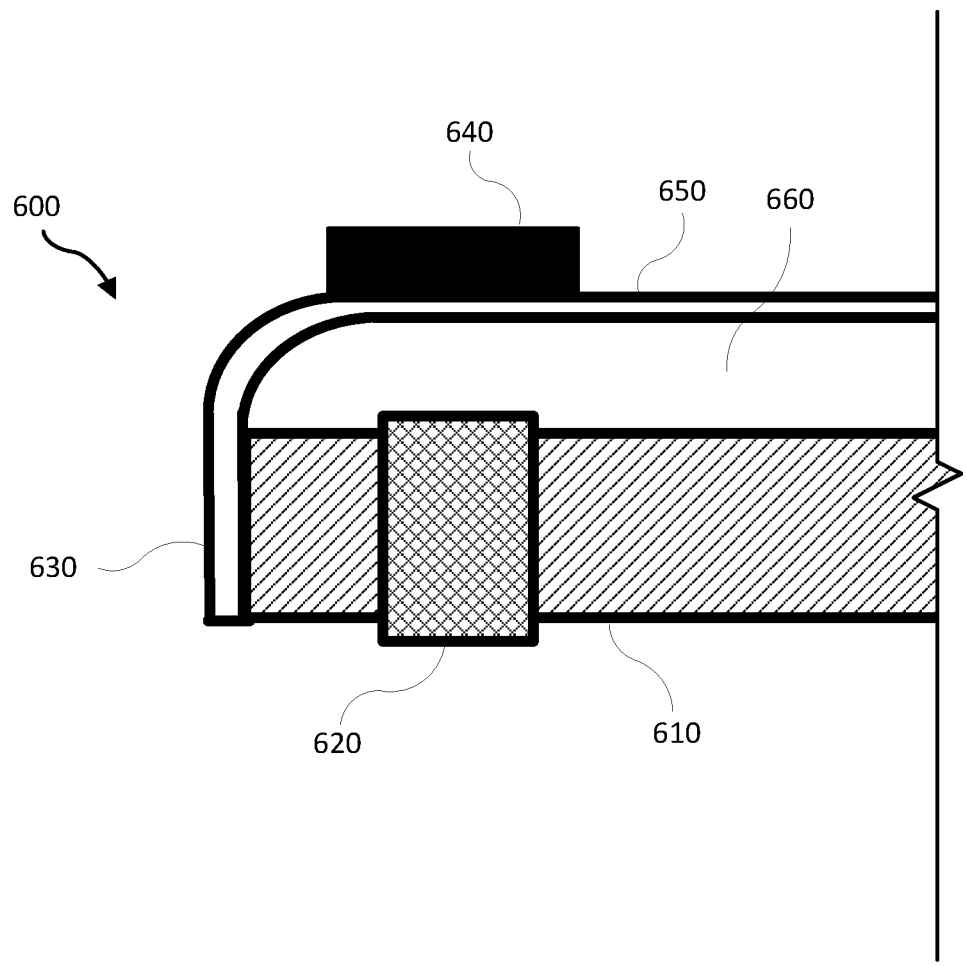
FIG. 6 is a partial view of an optical lens assembly with a hole in a structural support element.

FIG. 6 provides a partial view of an optical lens assembly with a hole in a structural support element. As shown in FIG. 6, an optical lens assembly 600 may include a structural support element 610, a hole 620, an edge seal 630, a force distributor 640, a deformable bounding element 650, and a cavity 660. FIG. 6 shows a partial view of an optical lens assembly 600 produced by a method which introduces minimal obstruction. The deformable medium filling and sealing process may be performed on an empty, pre-sealed cavity 660 through a perimeter region of optical lens assembly 600 along a frame bezel (not shown) that may be obscured by elements of the optical lens assembly frame or other structural assembly elements.

FIG. 6 provides a partial view of optical lens assembly 600 after filling the deformable medium through hole 620. Hole 620 in structural support element 610 may be etched or cut into a perimeter region of structural support element 610. Structural support element 610 and deformable bounding element 650 may be pre-sealed along edge seal 630 using adhesives, heat bonding or ultrasonic welding. Hole 620 may be disposed beneath force distributor 640 and is therefore not visible in optical lens assembly 600. A tube, needle or other suitable filling device may be inserted in hole 620 and the deformable medium may be injected into cavity 660 until cavity 660 is filled. After cavity 660 is filled, the tube, needle or other suitable filling device may be removed from hole 620 and hole 620 may be sealed (e.g., with a plug, an optically clear sealant, or cement compatible with the material of structural support element 610.

Figure 7:
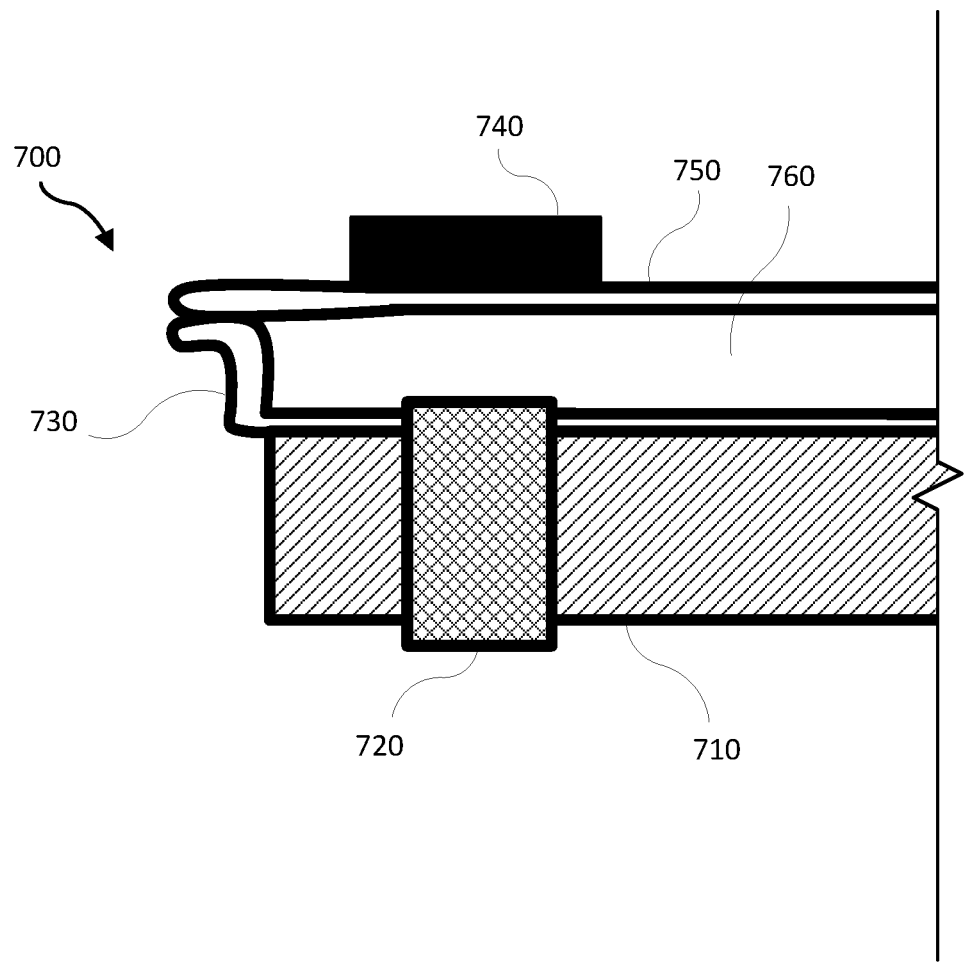
FIG. 7 is a partial view of an optical lens assembly with a hole in a structural support element and a deformable bounding element with a pre-formed cavity.

FIG. 7 provides a partial view of an example optical lens assembly with a hole in a structural support element and a deformable bounding element with a pre-formed cavity. As shown in FIG. 7, an optical lens assembly 700 may include a structural support element 710, a hole 720, a first portion of a deformable bounding element 730, an edge seal 735, a force distributor 740, a second portion of a deformable bounding element 750, and a cavity 760. FIG. 7 shows a partial view of an optical lens assembly 700 produced by a method which introduces minimal obstruction. The first portion of deformable bounding element 730 may be pre-formed to produce cavity 760. Cavity 760 may be formed into a shape capable of containing the deformable medium. Cavity 760 may be formed by injection molding, compression molding, thermoforming, rotational molding, blow molding or film insert molding. The first portion of deformable bounding element 730 formed into cavity 760 may be bonded to the cavity-adjacent surface of structural support element 710. The first portion of deformable bounding element 730 may be bonded to structural support element 710 using adhesives, heat bonding, ultrasonic bonding, or anodic bonding. Hole 720 may be etched or cut through a perimeter region of structural support element 710 and the first portion of deformable bounding element 730 thereby creating an entry point for the deformable medium to be injected into cavity 760. Hole 720 may be cut in any suitable manner (e.g., using a drill, a hot knife, a router, liquid pressure, pneumatic press, ultrasonic cutting, or a laser). The second portion of deformable bounding element 750 may be bonded to the first portion of deformable bounding element 730 on the perimeter edge surfaces of the first and second portions forming edge seal 735 and thereby sealing cavity 760. The bonding of the surfaces may be performed in any suitable manner (e.g., via compression, ultrasonic welding, adhesives, heat, or anodic bonding). Excess material on the outer perimeter of deformable bounding element 730 created during the bonding process may be trimmed using a knife blade, laser cutting, ultrasonic cutting or die cutting.

Hole 720 may be disposed beneath force distributor 740 and may not be visible in optical lens assembly 700. A tube, needle, or other suitable filling device as described above with respect to FIG. 5 may be inserted in hole 720 and the deformable medium may be injected into cavity 760 until cavity 760 is filled. After cavity 760 is filled, hole 720 may be sealed with a plug, an optically clear sealant, or cement compatible with the material of structural support element 710. Force distributor 740 may be adhered to a cavity-opposite side of the second portion of deformable bounding element 750.

Figure 8:
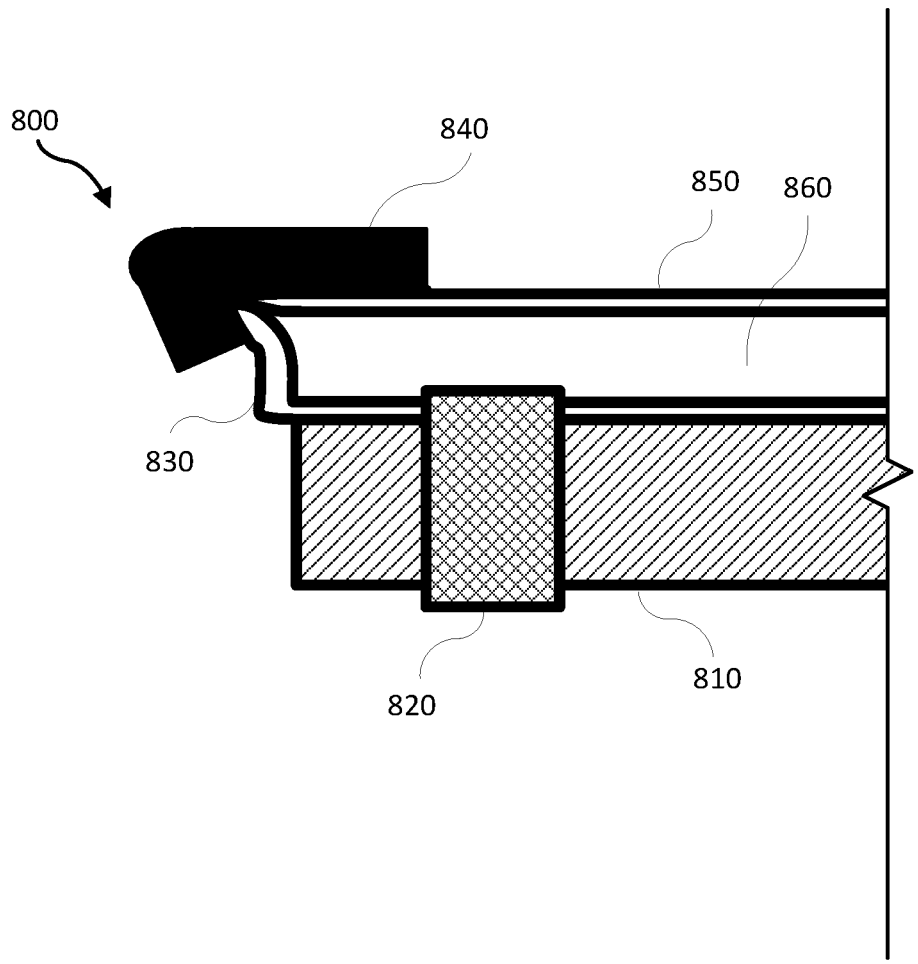
FIG. 8 is a partial view of an optical lens assembly with a hole in a structural support element and a deformable bounding element sealed by a crimped force distribution ring.

FIG. 8 provides a partial view of an optical lens assembly with a hole in a structural support element and a deformable bounding element sealed by a crimped force distribution ring. As shown in FIG. 8, an optical lens assembly 800 may include a structural support element 810, a hole 820, a first portion of a deformable bounding element 830, a force distributor 840, a second portion of a deformable bounding element 850, and a cavity 860. As will be explained in greater detail below, optical lens assembly 800, as shown in FIG. 8, may be produced by a method which introduces minimal obstruction. The first portion of deformable bounding element 830 may be pre-formed to produce cavity 860. The first portion of deformable bounding element 830 may be bonded to the cavity-adjacent surface of structural support element 810. Hole 820 may be etched or cut through a perimeter region of structural support element 810 and the first portion of deformable bounding element 830 thereby creating an entry point for the deformable medium to be injected into cavity 860. Force distribution ring 840 may be adhered to the second portion of deformable bounding element 850. The second portion of deformable bounding element 850 may be bonded to the first portion of deformable bounding element 830 on the perimeter edge surfaces of the first and second portions by applying a compression force to a portion of force distribution ring 840 thereby crimping the first and second portions together and forming the edge seal which creates sealed cavity 860. A tube, needle, or other suitable filling device as described above with respect to FIG. 5 may be inserted in hole 820 and the deformable medium may be injected into cavity 860 until cavity 860 is filled. After cavity 860 is filled, hole 820 may be sealed with a plug, an optically clear sealant, or cement compatible with the material of structural support element 810.

FIGS. 1-8 show methods and structures of a single optical lens assembly in which an actuator is interfaced with a force distributor that applies a force resulting in the deformable bounding element changing an optical power. In some examples, optical lens assemblies for a single eye of an HMD are shown in FIGS. 9 and 10 and represent an example of an application for the varifocal accommodation capability of the optical lens assembly.

Figure 9:
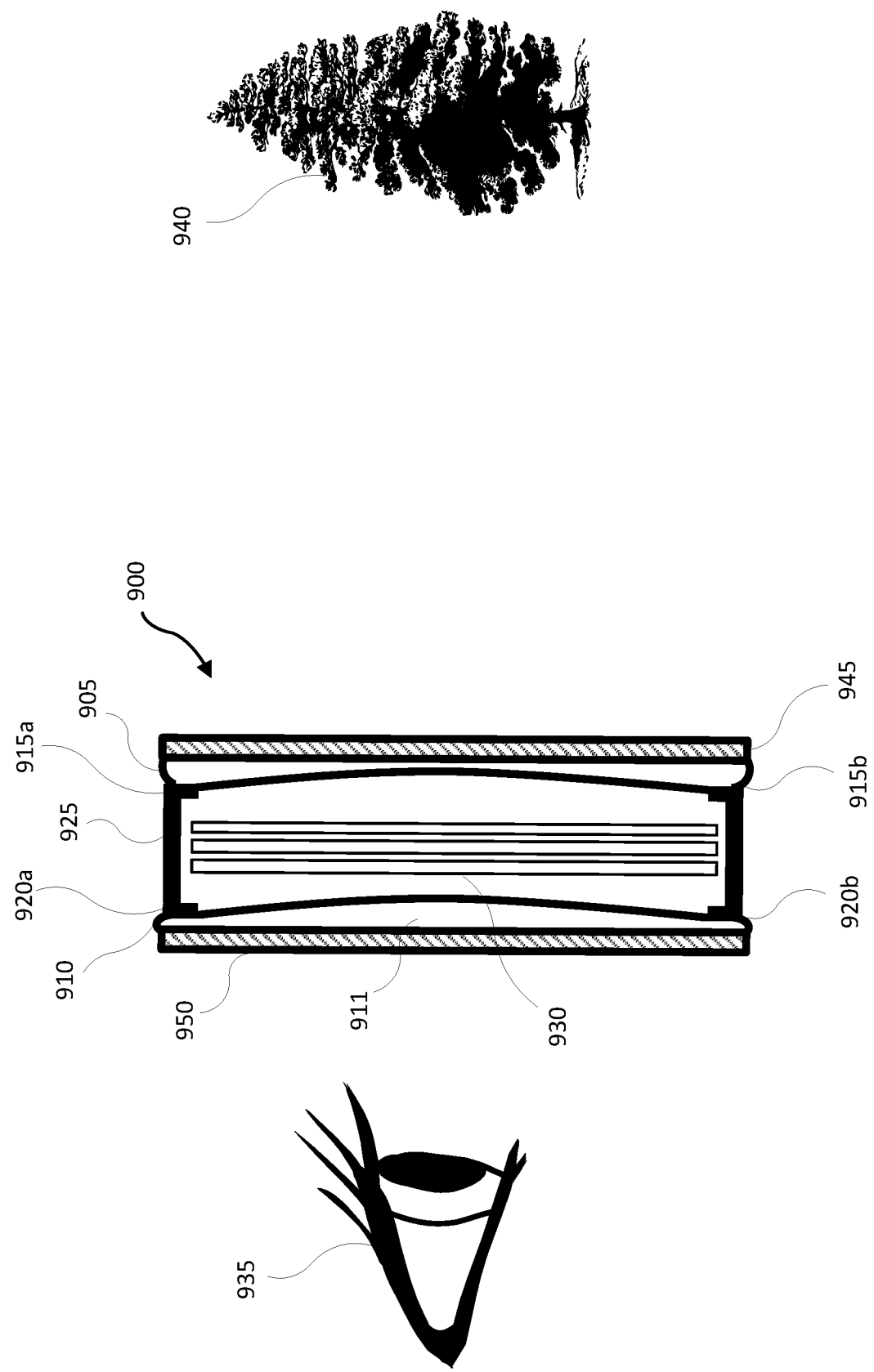
FIG. 9 is a side view of an optical lens assembly.
Figure 10:
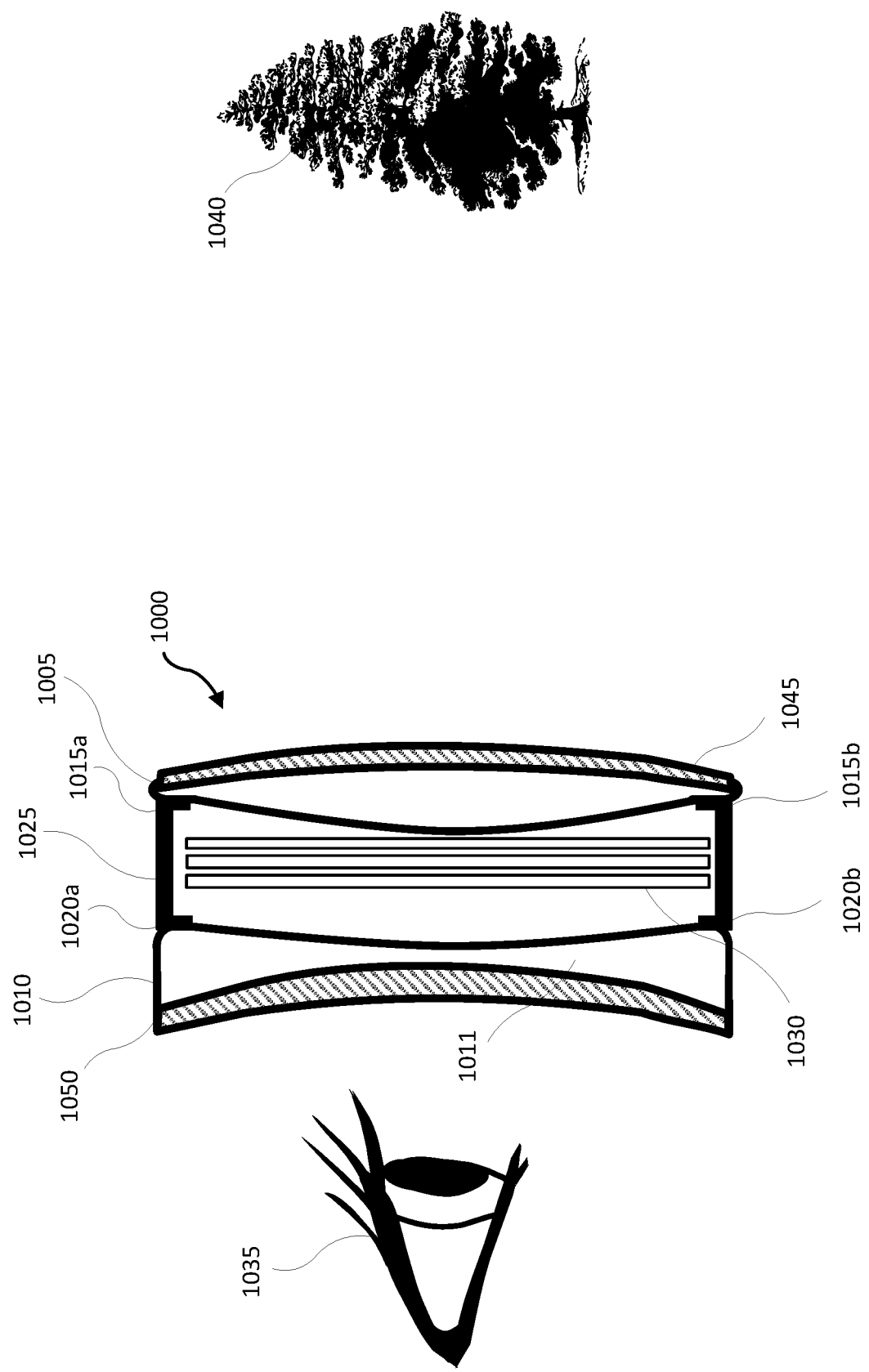
FIG. 10 is a side view of an optical lens assembly with an ophthalmic corrective element.

As shown in FIGS. 9 and 10, respectively, optical lens apparatus 900 (or 1000) of the HMD stack may consist of an RGB waveguide 930 (or 1030) for the display, with two optical lens assemblies mounted on HMD frame 925 (or 1025). One optical lens assembly may be positioned in front of the display and the second optical lens assembly may be positioned behind the display. The optical lens assembly positioned in front of the display and located nearest to eye 935 (or 1035) may include a structural support element 950 (or 1050), a deformable bounding element 910 (or 1010) and a deformable-medium-filled cavity which may be actuated through applied force and displacement at force distributor 920a and 920b (or 1020a and 1020b) to adjust the focus of the virtual image created by RGB waveguide 930 (or 1030). The optical lens assembly behind RGB waveguide 930 (or 1030) may include structural support element 945 (or 1045), deformable bounding element 905 (or 1005) and deformable medium filled cavity 911 (or 1011) which may be simultaneously actuated by force distributor 915a and 915b (or 1015a and 1015b) to create a zero-power image of real world 940 (or 1040).

As an example, in FIG. 9, optical lens apparatus 900 may include structural support elements 945 and 950 which include planar surfaces on both the cavity-adjacent side and the cavity-opposite side. The combination of optical lens apparatus 900 with additional components such as eye tracking element(s), an outer protective/anti-reflective lens, and corrective ophthalmic optics may be included in the functional elements of the HMD. Deformable bounding elements 905 and 910 of optical lens apparatus 900 may be coated with an anti-reflective treatment. The anti-reflective treatment may withstand repeated deformations without degradation, yield strain or yield failure. The anti-reflective treatment may be applied to the deformable bounding elements 905 and 910 using multiple methods including chemical vapor deposition, thermal evaporation and spin coating. The materials used to coat deformable bounding elements 905 and 910 which provide the anti-reflective properties may include various types of polymers and/or nanoparticles. The anti-reflective material may be applied to a pre-stretched or unstretched deformable bounding element during the coating process which may increase actuation speed when adjusting an optical focus. The anti-reflective material and the methods of applying the anti-reflective material may reduce production costs. Applying multiple layers of anti-reflective material, each having a different index of refraction between adjacent layers, results in an anti-reflective treatment which reduces unwanted reflected light from entering the optical lens assembly.

To adjust an optical focus, the adjustment mechanism may modify the optical power provided for an image originating from RGB waveguide 930 between deformable optical elements 905 and 910 without modifying the optical power provided for an image originating beyond deformable optical elements 905 and 910 (e.g., from a real-world object). In some examples, this may allow apparatuses and systems described herein to reduce, minimize, or eliminate accommodation-vergence conflict caused by augmented reality displays by modifying the apparent accommodation distance of images while minimizing any distortion to real-world images. Furthermore, in some examples, by using a single actuator to drive carriage element 925 connecting deformable optical elements 905 and 910, these apparatuses and systems may reduce the amount of actuating force applied to deform deformable optical elements 905 and 910. In addition, the use of a single adjustment mechanism may reduce the form factor, the cost of manufacture, and/or the potential points of failure of an optical lens assembly.

In some examples, carriage 925 may be driven by one or more actuators. For example, the actuator may include a mechanical or an electromechanical actuator. Examples of actuators that may drive carriage 925 may include, without limitation, a piezoelectric, an electroactive polymer, a piezo electric polymer, a dielectric elastomer, an electrostrictive polymer, a shape memory alloy, a voice coil, a pneumatic actuator, an electromagnetic motor (e.g., a servo motor, a stepper motor, a DC motor, etc.), a hydraulic actuator, or a combination thereof. The actuator may be augmented with secondary passive actuators such as cams, springs, etc. to efficiently drive carriage 925. The actuator may move carriage 925 in a radial direction which is defined as normal to a major plane of the optical lens assembly, axially which is defined as perpendicular to the radial direction, or a combination thereof. Each of the optical lens assemblies in the HMD may be simultaneously actuated or individually actuated.

In some examples, the actuator may be driven by a controller which measures the ambient and internal temperatures of the HMD and adjusts the speed of the actuators as a function of the ambient and internal temperatures.

As another example of multiple optical lens assemblies used in tandem, FIG. 10 illustrates an optical lens apparatus 1000 with structural support elements 1045 and 1050 that include non-planar surfaces on both the cavity-adjacent side and the cavity-opposite side. Accordingly, the description of FIG. 9 above may also apply to FIG. 10, with the exception that structural support elements 1045 and 1050 are non-planar (and may therefore, e.g., provide a corrective optical function and/or modify the range of optical power for viewing display 1030 achieved by adjusting the optical lens assemblies). In some examples, the structural support elements in optical lens apparatus 1000 may be functionally integrated with additional elements. For example, in the more integrated optical lens assembly 1000, the structural support element may include an ophthalmic corrective optic and/or an eye tracking element. The curvature of structural support element 1045, which may be furthest from eye 1035, may result in improved anti-reflective properties and therefore may have a high optical quality as an outer protective lens element.

For realization of a sub-assembly with similar functionality to optical lens assembly 900, structural support elements 1050 and 1045 may be zero power meniscus lens elements for improved anti-reflective properties and easier integration with non-planar optical eye tracking and/or ophthalmic optical elements at structural support element 1050.

Figure 11:
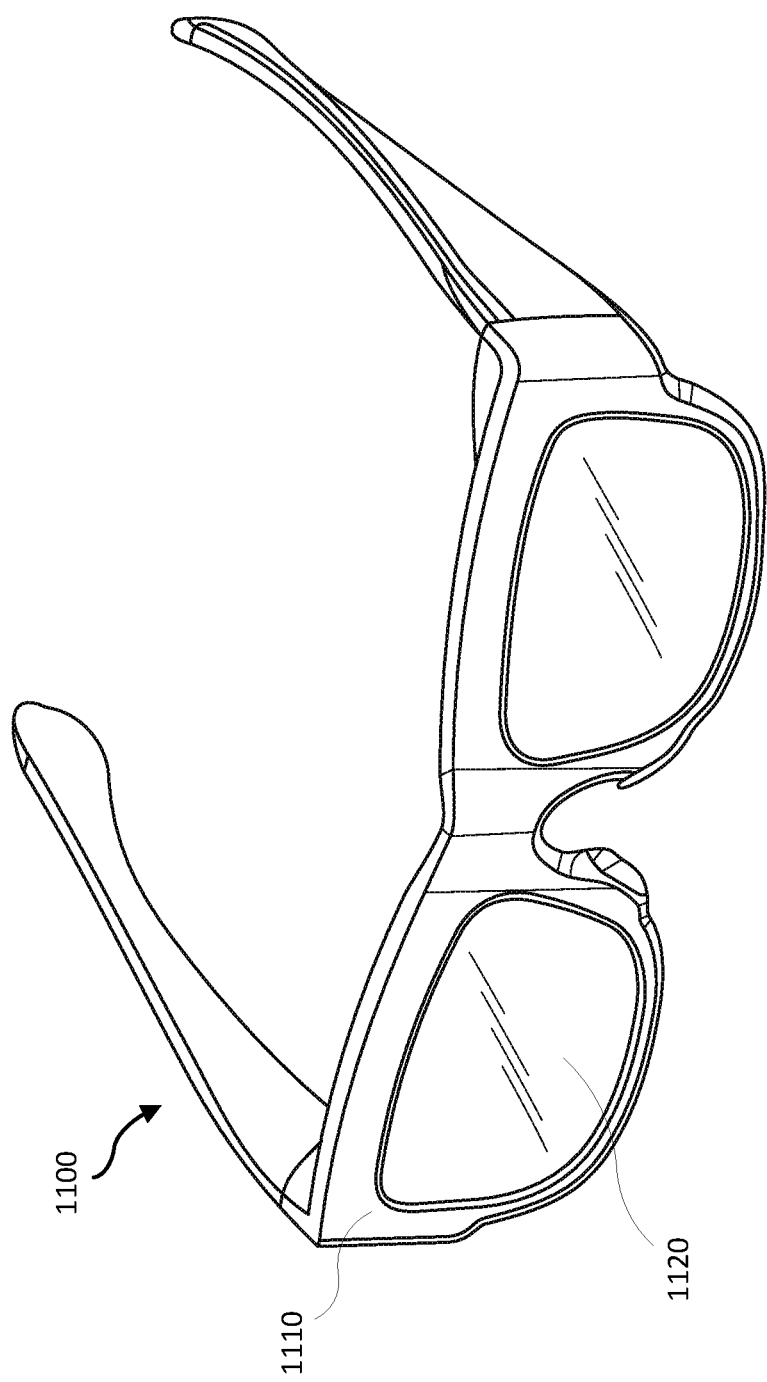
FIG. 11 is a perspective view of head-mounted device.

FIG. 11 shows an HMD 1100 which may include the deformable optical element and RGB waveguide assemblies 900 and/or 1000 integrated into eye piece 1120 and mounted within bezel 1110. Any features or defects related to the filling and/or sealing of the deformable optical element assemblies during the filling and sealing process may be located within bezel 1110 area and therefore may not visible through clear aperture of eye piece 1120. For example, the ratio of a clear aperture area of the eye piece 1120 to an overall surface area of the deformable optical element may be at least about 70 percent, at least about 75 percent, at least about 80 percent, at least about 85 percent, at least about 90 percent, or at least about 95 percent.

Figure 12:
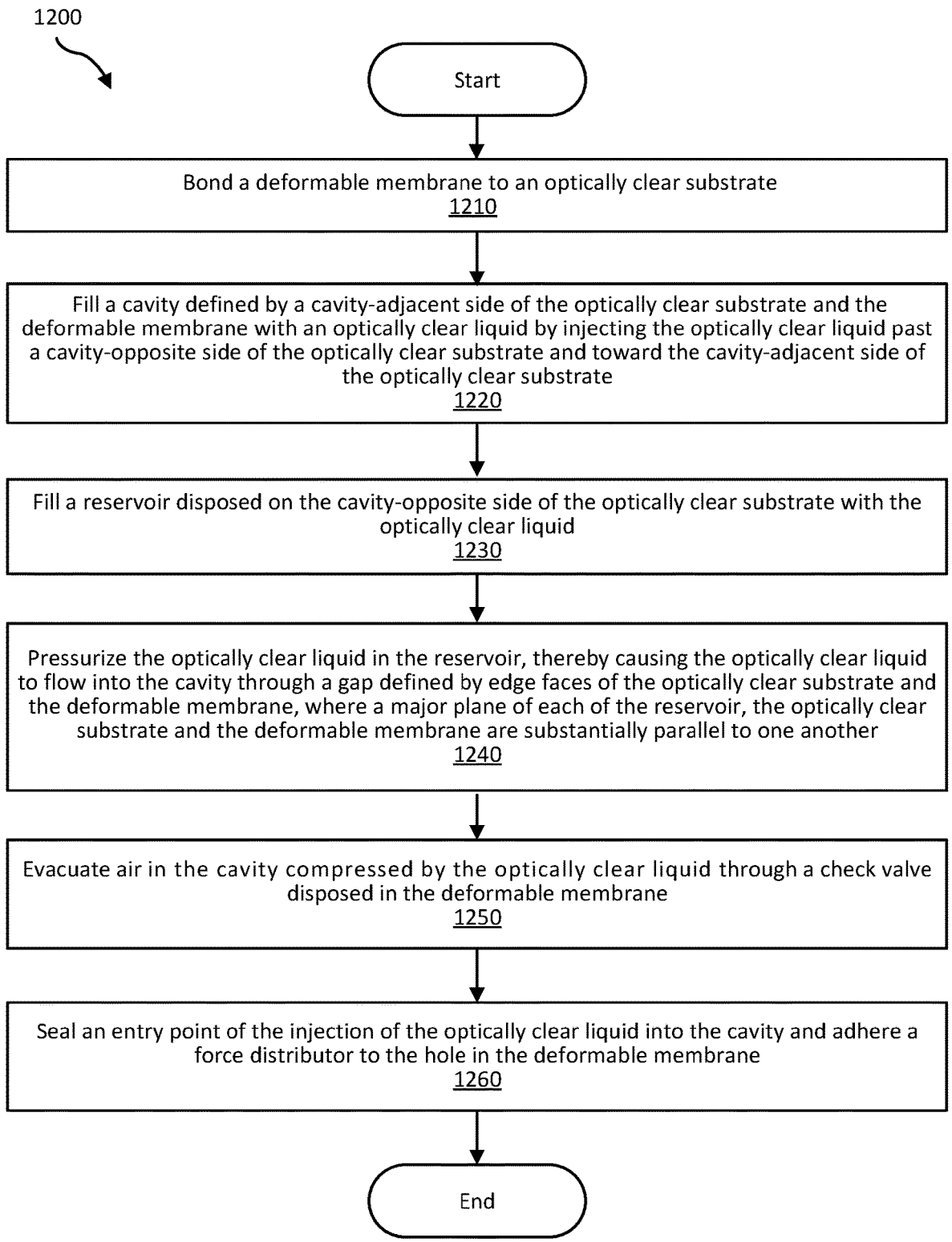
FIG. 12 shows a flow diagram of an example method of filling and sealing an optical lens assembly using a reservoir.

FIG. 12 shows a flow diagram of an example method 1200 for filling and sealing an optical lens assembly using a reservoir as described herein. As shown in FIG. 12, the method may include, at step 1210, bonding a deformable bounding element to a structural support element. At step 1220, the method may include filling a cavity defined by a cavity-adjacent side of the structural support element and the deformable bounding element with a deformable medium by injecting the deformable medium past a cavity-opposite side of the structural support element and toward the cavity-adjacent side of the structural support element. At step 1230, the method may include filling a reservoir disposed on the cavity-opposite side of the structural support element with the deformable medium. At step 1240, the method may include pressurizing the deformable medium in the reservoir, thereby causing the deformable medium to flow into the cavity through a gap defined by edge faces of the structural support element and the deformable bounding element. In some examples, a major plane of each of the reservoir, the structural support element, and the deformable bounding element may be substantially parallel to one another. At step 1250, the method may include evacuating air in the cavity displaced by the deformable medium through a check valve disposed in the deformable bounding element having a portion defining a hole. At step 1260, the method may include sealing an entry point of the injection of the deformable medium into the cavity and adhering a force distributor to the hole in the deformable bounding element.

Figure 13:
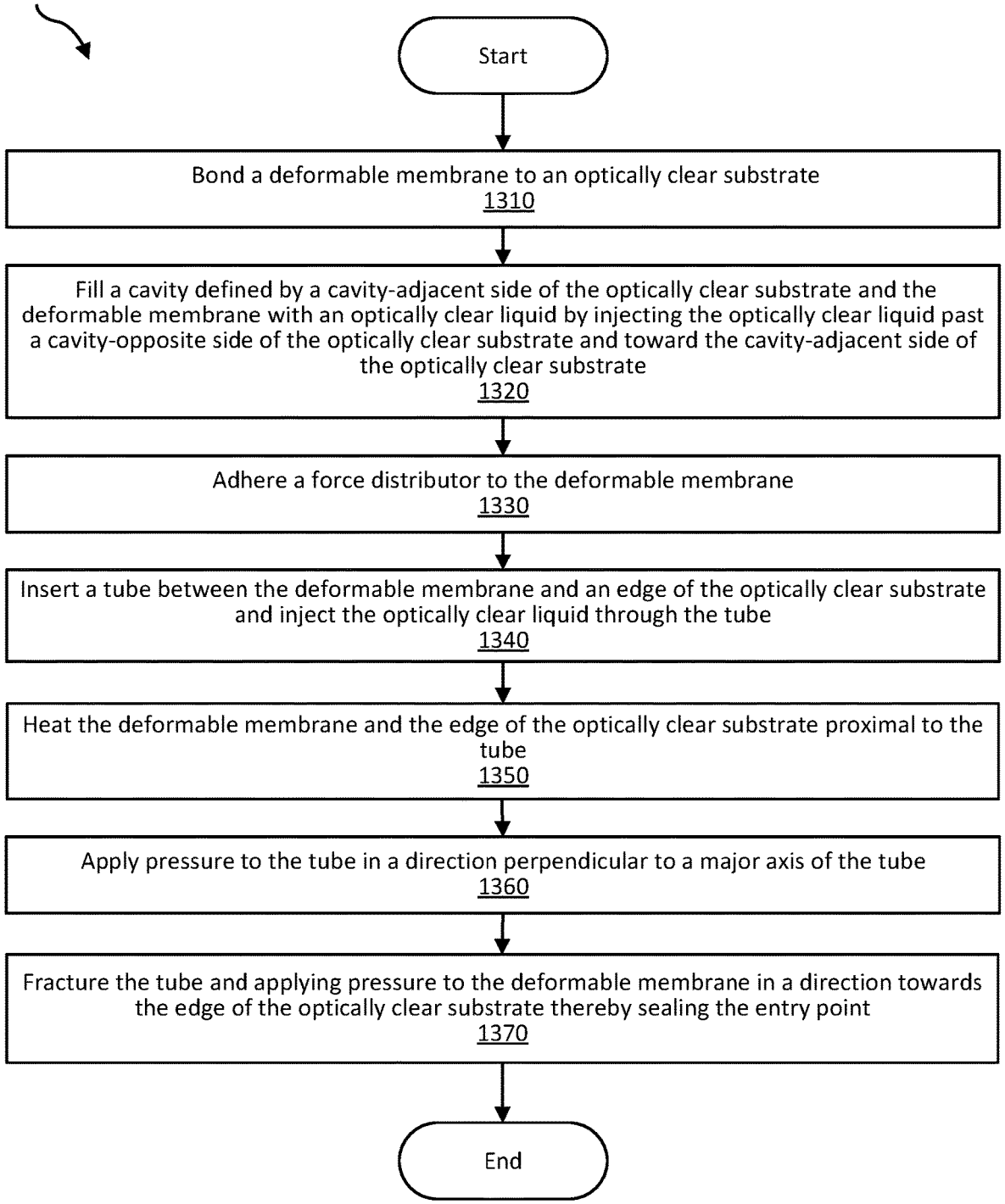
FIG. 13 shows a flow diagram of an example method of filling and sealing an optical lens assembly using a fill tube.

FIG. 13 shows a flow diagram of an example method 1300 for filling and sealing an optical lens assembly using a fill tube as described herein. As shown in FIG. 13, the method may include at step 1310, bonding a deformable bounding element to a structural support element. At step 1320, the method may include filling a cavity defined by a cavity-adjacent side of the structural support element and the deformable bounding element with a deformable medium by injecting the deformable medium past a cavity-opposite side of the structural support element and toward the cavity-adjacent side of the structural support element. At step 1330, the method may include adhering a force distributor to the deformable bounding element. At step 1340, the method may include inserting a tube between the deformable bounding element and an edge of the structural support element and injecting the deformable medium through the tube. At step 1350, the method may include heating the deformable bounding element and the edge of the structural support element proximal to the tube. At step 1360, the method may include applying pressure to the tube in a direction perpendicular to a major axis of the tube. At step 1370, the method may include fracturing the tube and applying pressure to the deformable bounding element in a direction towards the edge of the structural support element sealing the entry point.

Figure 14:
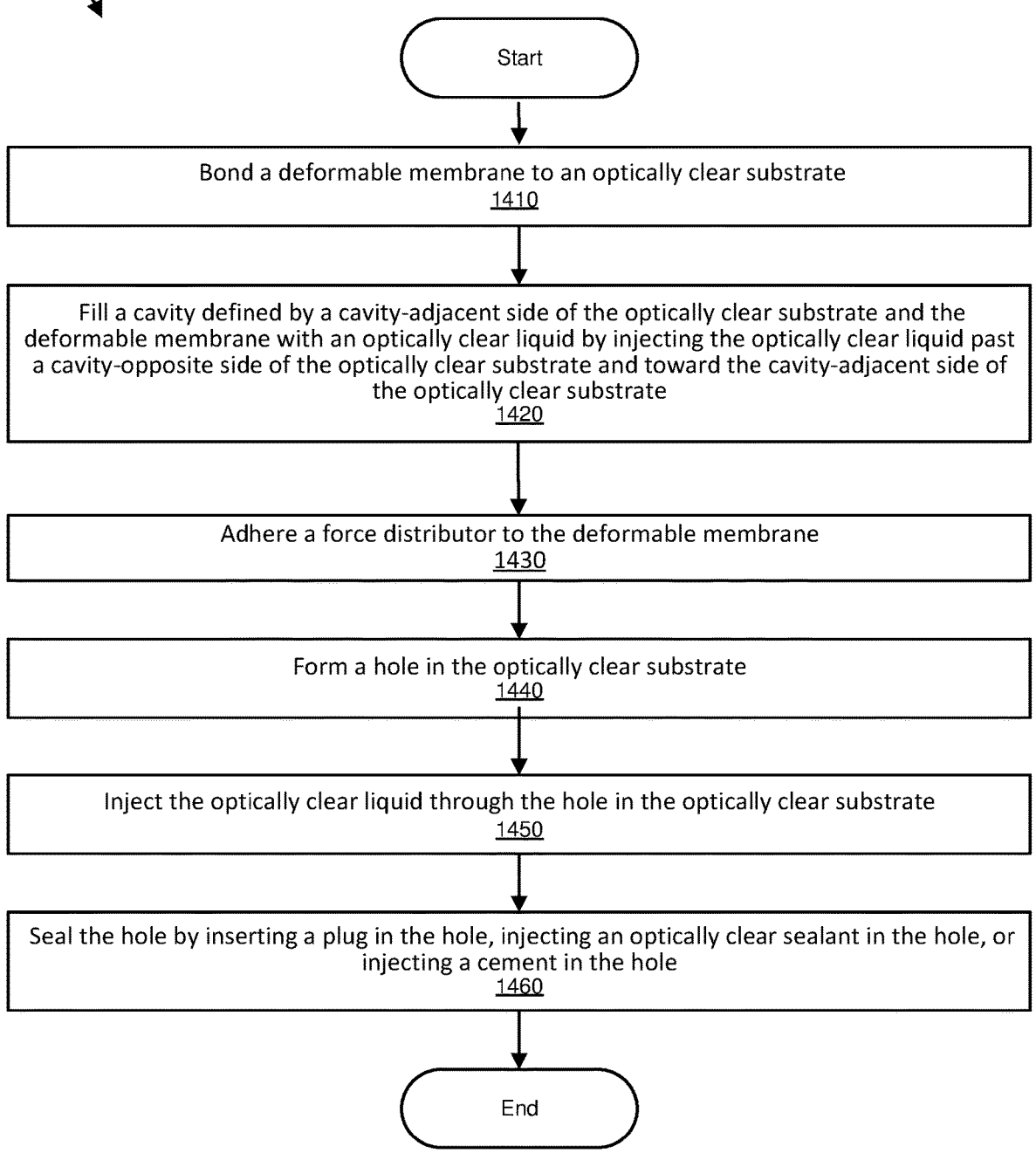
FIG. 14 shows a flow diagram of an example method of filling and sealing an optical lens assembly through a hole in a structural support element.

FIG. 14 shows a flow diagram of an example method 1400 for filling and sealing an optical lens assembly through a hole in a structural support element as described herein. As shown in FIG. 14, the method may include at step 1410, bonding a deformable bounding element to a structural support element. At step 1420, the method may include filling a cavity defined by a cavity-adjacent side of the structural support element and the deformable bounding element with a deformable medium by injecting the deformable medium past a cavity-opposite side of the structural support element and toward the cavity-adjacent side of the structural support element. At step 1430, the method may include adhering a force distributor to the deformable bounding element. At step 1440, the method may include forming a hole defined in the structural support element. At step 1450, the method may include injecting the deformable medium through the hole in the structural support element. At step 1460, the method may include sealing the hole by inserting a plug in the hole, injecting an optically clear sealant in the hole or injecting a cement in the hole.

As described in detail above, the instant disclosure describes methods, systems, and apparatuses for fabricating ultra-thin, large-aperture optical lens assemblies. In some examples, the cavity of an optical lens assembly may be filled with a deformable medium from the cavity-opposite side of the substrate to the cavity-adjacent side of the substrate. In some examples, optical lens assemblies produced by the methods of the instant disclosure may provide a wide range of optical power, may have a wide aperture free from obstructions, and may be ultra-thin and lightweight. The optical lens assembly may also be interfaced or integrated with other components (i.e. ophthalmic lens, eye tracking, wave guides, etc.) in the AR/VR optical lens assembly. An HMD may incorporate the ultra-thin, large aperture optical lens assemblies resulting in a lighter weight and an aesthetically pleasing design.

Embodiments of the instant disclosure may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The process parameters and sequence of the steps described and/or illustrated herein are given by way of example only and may be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A method comprising:
   bonding a deformable bounding element to a structural support element, wherein the deformable bounding element and a cavity-adjacent side of the structural support element define a cavity of a deformable optical element;
   filling the cavity with a deformable medium by injecting the deformable medium past a cavity-opposite side of the structural support element and toward the cavity-adjacent side of the structural support element; and
   sealing an entry point of the injection of the deformable medium into the cavity.

2. The method of claim 1, further comprising:
   filling a reservoir disposed on the cavity-opposite side of the structural support element with the deformable medium; and
   pressurizing the deformable medium in the reservoir, thereby causing the deformable medium to flow into the cavity through a gap defined by an edge face of the structural support element and an edge face of the deformable optical element, wherein a major plane of each of the reservoir, the structural support element and the deformable bounding element are substantially parallel to one another.

3. The method of claim 2, wherein the gap is sized such that there is substantially no capillary effect on the deformable medium.

4. The method of claim 2, further comprising:
   evacuating air in the cavity compressed by the deformable medium through a check valve disposed in the deformable bounding element having a portion defining a hole;
   removing the check valve disposed in the hole in the deformable bounding element; and
   adhering a force distributor to the hole in the deformable bounding element.

5. The method of claim 2, wherein sealing the entry point of the injection of the deformable medium into the cavity comprises:
   coating an edge of the structural support element with an adhesion promoting layer; and sealing the gap between the edge face of the structural support element and the edge face of the deformable bounding element.

6. The method of claim 5, wherein sealing the gap comprises at least one of heat bonding the edge face of the structural support element to the edge face of the deformable bounding element or ultrasonic welding of the edge face of the structural support element to the edge face of the deformable bounding element.

7. The method of claim 1, further comprising:
   adhering a force distributor to the deformable bounding element,
   wherein injecting the deformable medium comprises:
   inserting a tube between the deformable bounding element and an edge of the structural support element; and
   injecting the deformable medium through the tube.

8. The method of claim 7, wherein sealing the entry point of the injection of the deformable medium into the cavity comprises:
   heating the deformable bounding element and the edge of the structural support element proximal to the tube;
   applying pressure to the tube in a direction perpendicular to a major axis of the tube;
   fracturing the tube; and
   applying pressure to the deformable bounding element in a direction towards the edge of the structural support element.

9. The method of claim 1, further comprising:
adhering a force distributor to the deformable bounding element; and
forming a hole in the structural support element,
wherein:
  injecting the deformable medium comprises injecting the deformable medium through the hole in the structural support element; and
  sealing the entry point of the injection of the deformable medium into the cavity comprises sealing the hole in the structural support element.

10. The method of claim 9, wherein the hole is disposed on a perimeter of the structural support element within a bezel-mounting area, thereby substantially maintaining a clear aperture area afforded by the deformable bounding element and the structural support element.

11. The method of claim 9, wherein sealing the hole comprises sealing the hole with an optically clear sealant.

12. The method of claim 9, wherein bonding the deformable bounding element to the structural support element comprises:
forming a first portion of the deformable bounding element into a shape that defines the cavity;
adhering a surface of the first portion of the deformable bounding element to a surface of the cavity-adjacent side of the structural support element; and
sealing the cavity by bonding a perimeter edge of the first portion of the deformable bounding element to a perimeter edge of a second portion of the deformable bounding element.

13. The method of claim 12, wherein bonding the perimeter edge of the first portion of the deformable bounding element to the perimeter edge of the second portion of the deformable bounding element comprises crimping the force distributor around the perimeter edges of the first and second portions of the deformable bounding element.

14. The method of claim 1, wherein the structural support element comprises at least one of an eye tracking element or corrective ophthalmic properties.

15. The method of claim 1, wherein bonding the deformable bounding element to the structural support element, filling the cavity with the deformable medium, and sealing the entry point of the injection produces an optical lens assembly having a thickness of less than two millimeters.

\* \* \* \* \*